US009294046B2

(12) United States Patent
Scott et al.

(10) Patent No.: US 9,294,046 B2
(45) Date of Patent: Mar. 22, 2016

(54) RF POWER AMPLIFIER WITH PM FEEDBACK LINEARIZATION

(71) Applicant: RF Micro Devices (Cayman Islands), Ltd., George Town, Grand Cayman (KY)

(72) Inventors: Baker Scott, San Jose, CA (US); George Maxim, Saratoga, CA (US); Dirk Robert Walter Leipold, San Jose, CA (US)

(73) Assignee: RF Micro Devices (Cayman Islands), Ltd., George Town (KY)

( * ) Notice: Subject to any disclaimer, the term of this patent is extended or adjusted under 35 U.S.C. 154(b) by 0 days.

(21) Appl. No.: 14/216,794

(22) Filed: Mar. 17, 2014

(65) Prior Publication Data

US 2014/0266459 A1    Sep. 18, 2014

Related U.S. Application Data

(60) Provisional application No. 61/793,583, filed on Mar. 15, 2013, provisional application No. 61/789,508, filed on Mar. 15, 2013, provisional application No. 61/800,772, filed on Mar. 15, 2013, provisional (Continued)

(51) Int. Cl.
*H03F 1/36* (2006.01)
*H03F 1/32* (2006.01)
(Continued)

(52) U.S. Cl.
CPC .............. *H03F 1/3241* (2013.01); *H01F 27/28* (2013.01); *H01F 27/385* (2013.01); *H03F 1/32* (2013.01);
(Continued)

(58) Field of Classification Search
CPC ...................................... H03F 1/36; H03F 1/14
USPC .......................................... 330/107, 109, 307
See application file for complete search history.

(56) References Cited

U.S. PATENT DOCUMENTS 5,420,536 A * 5/1995 Faulkner et al. .............. 330/149
5,507,014 A    4/1996 Wray et al.
(Continued)

FOREIGN PATENT DOCUMENTS

EP         1184977 A2    3/2002
WO    2005117255 A1    12/2005

OTHER PUBLICATIONS

Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.

(Continued)

*Primary Examiner* — Henry Choe
(74) *Attorney, Agent, or Firm* — Withrow & Terranova, P.L.L.C.

(57) ABSTRACT

Circuitry, which includes a package interface, an RF amplification circuit, and a closed-loop phase linearization circuit, is disclosed. The package interface receives an RF signal and provides an amplified RF signal. The RF amplification circuit amplifies the RF signal to generate the amplified RF signal, such that an intermediate RF signal is generated during amplification of the RF signal. The closed-loop phase linearization circuit endogenously establishes a target phase of the amplified RF signal using the RF signal. Further, the closed-loop phase linearization circuit applies a phase-shift to the intermediate RF signal based on a difference between the target phase and a measured phase, which is representative of a phase of the amplified RF signal, wherein the phase-shift reduces phase distortion in the amplified RF signal.

25 Claims, 28 Drawing Sheets

Related U.S. Application Data application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | |
|---|---|
| H03F 3/195 | (2006.01) |
| H03F 3/21 | (2006.01) |
| H03F 3/19 | (2006.01) |
| H03F 3/213 | (2006.01) |
| H01F 27/28 | (2006.01) |
| H01F 27/38 | (2006.01) |
| H03H 7/09 | (2006.01) |
| H03H 7/01 | (2006.01) |

(52) U.S. Cl.
CPC .............. *H03F 3/19* (2013.01); *H03F 3/195* (2013.01); *H03F 3/211* (2013.01); *H03F 3/213* (2013.01); *H03H 7/09* (2013.01); *H03H 7/1775* (2013.01)

(56) References Cited

U.S. PATENT DOCUMENTS

| | | | | |
|---|---|---|---|---|
| 5,675,288 | A * | 10/1997 | Peyrotte et al. | 330/149 |
| 6,137,354 | A | 10/2000 | Dacus et al. | |
| 6,330,289 | B1 | 12/2001 | Keashly et al. | |
| 6,707,338 | B2 | 3/2004 | Kenington et al. | |
| 6,819,938 | B2 | 11/2004 | Sahota | |
| 6,836,517 | B2 | 12/2004 | Nagatani et al. | |
| 6,980,774 | B2 | 12/2005 | Shi | |
| 7,102,430 | B2 | 9/2006 | Johnson et al. | |
| 7,164,313 | B2 | 1/2007 | Capofreddi et al. | |
| 7,212,798 | B1 | 5/2007 | Adams et al. | |
| 7,250,815 | B2 | 7/2007 | Taylor et al. | |
| 7,317,353 | B2 | 1/2008 | Hayase | |
| 7,321,264 | B2 | 1/2008 | Kokkeler | |
| 7,333,557 | B2 | 2/2008 | Rashev et al. | |
| 7,340,229 | B2 | 3/2008 | Nakayama et al. | |
| 7,471,739 | B1 * | 12/2008 | Wright | 375/297 |
| 7,652,532 | B2 | 1/2010 | Li et al. | |
| 7,917,106 | B2 | 3/2011 | Drogi et al. | |
| 7,970,360 | B2 | 6/2011 | Pei | |
| 8,013,674 | B2 | 9/2011 | Drogi et al. | |
| 8,126,409 | B2 | 2/2012 | Osman et al. | |
| 8,175,551 | B2 | 5/2012 | Akaiwa | |
| 8,344,806 | B1 | 1/2013 | Franck et al. | |
| 8,410,846 | B2 * | 4/2013 | Zare-Hoseini | 330/51 |
| 8,620,233 | B2 | 12/2013 | Brobston | |
| 8,624,678 | B2 | 1/2014 | Scott et al. | |
| 8,653,888 | B2 * | 2/2014 | Watanabe | 330/107 |
| 8,653,890 | B1 * | 2/2014 | Ahmed et al. | 330/124 R |
| 8,736,511 | B2 | 5/2014 | Morris, III | |
| 8,749,310 | B2 | 6/2014 | Hayes et al. | |
| 8,791,769 | B2 | 7/2014 | Leong et al. | |
| 8,829,995 | B2 | 9/2014 | Cohen | |
| 8,841,983 | B2 | 9/2014 | Newton et al. | |
| 9,094,104 | B2 | 7/2015 | Din et al. | |
| 9,124,355 | B2 | 9/2015 | Black et al. | |
| 9,203,455 | B2 | 12/2015 | Yang et al. | |
| 2002/0057139 | A1 | 5/2002 | Matsumura et al. | |
| 2002/0186378 | A1 | 12/2002 | Tazartes et al. | |
| 2003/0008577 | A1 | 1/2003 | Quigley et al. | |
| 2004/0121741 | A1 | 6/2004 | Rashev et al. | |
| 2005/0123064 | A1 | 6/2005 | Ben-Ayun et al. | |
| 2005/0195063 | A1 | 9/2005 | Mattsson | |
| 2005/0237144 | A1 | 10/2005 | Einzinger et al. | |
| 2006/0033602 | A1 | 2/2006 | Mattsson | |
| 2006/0226943 | A1 | 10/2006 | Marques | |
| 2008/0122560 | A1 | 5/2008 | Liu | |
| 2011/0163824 | A1 | 7/2011 | Kawano | |
| 2011/0241163 | A1 | 10/2011 | Liu et al. | |
| 2012/0081192 | A1 | 4/2012 | Hanaoka | |
| 2013/0244591 | A1 | 9/2013 | Weissman et al. | |
| 2015/0054582 | A1 * | 2/2015 | Goss | 330/279 |

OTHER PUBLICATIONS

Brounley, Richard, W., "Matching Networks for Power Amplifiers Operating into High VSWR Loads," High Frequency Electronics, May 2004, pp. 58-62.

Charles, C.T., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.

Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.

D'Andrea, Aldo N., et al., "RF Power Amplified Linearization through Amplitude and Phase Predistortion," IEEE Transactions on Communications, vol. 44, No. 11, Nov. 1996, pp. 1477-1484.

Dawson, J., et al., "Automatic Phase Alignment for a Fully Integration Cartesian Feedback Power Amplifier System," IEEE Journal of Solid-State Circuits, vol. 38, No. 12, Dec. 2003, pp. 2269-2279.

Dawson, Joel L., "Feedback Linearization of RF Power Amplifiers," Dissertation for Stanford University, Stanford, Calif., Aug. 2003, 191 pages.

Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.

Do, Ji-Hoon, et al., "W-CDMA High Power Amplifier Using Anti-Phase Intermodulation Distortion Linearization Technology," Asia-Pacific Microwave Conference, Dec. 11-14, 2007, Bangkok, Thialand, 4 pages.

Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.

Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.

Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.

Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.

Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.

Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.

Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.

Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.

Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.

Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.

Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.

(56) References Cited

OTHER PUBLICATIONS

Rachakonda, Anil, et al., "Log Amps and Directional Couplers Enable VSWR Detection," RF Design Magazine, Jan. 2007, pp. 28-34.
Scuderi, Antonino, et al., "A VSWR-Rugged Silicon Bipolar Rf Power Amplifier," Proceedings of the Bipolar/BiCMOS Circuits and Technology Meeting, Oct. 9-11, 2005, pp. 116-119.
So, Jinhyun, et al., "Digital Predistortion Based on Envelope Feedback," IEEE International Conference on Acoustics, Speech and Signal Processing (ICASSP), Mar. 25-30, 2012, Kyoto, Japan, pp. 3169-3172.
Woo, Wangmyong, et al., "A New Envelope Predistortion Linearization Architecture for Handset Power Amplifiers," IEEE Radio and Wireless Conference, Sep. 19-22, 2004, pp. 175-178.
Zhang, X., et al., "Gain/Phase Imbalance-Minimization Techniques for LINC Transmitters," IEEE Transactions on Microwave Theory and Techniques, vol. 49, No. 12, Dec. 2001, pp. 2507-2516.
International Search Report and Written Opinion for PCT/US2014/030431, mailed Jun. 20, 2014, 14 pages.
Non-Final Office Action for U.S. Appl. No. 14/216,560, mailed Jul. 16, 2015, 9 pages.
Non-Final Office Action for U.S. Appl. No. 14/218,953, mailed Jul. 24, 2015, 10 pages.
Non-Final Office Action for U.S. Appl. No. 14/215,815, mailed May 4, 2015, 13 pages.
Non-Final Office Action for U.S. Appl. No. 14/216,376, mailed May 7, 2015, 8 pages.
Non-Final Office Action for U.S. Appl. No. 14/217,199, mailed Jul. 2, 2015, 6 pages.
Notice of Allowance for U.S. Appl. No. 14/215,815, mailed Oct. 1, 2015, 7 pages.
Non-Final Office Action for U.S. Appl. No. 14/215,800, mailed Nov. 20, 2015, 5 pages.
Final Office Action for U.S. Appl. No. 14/217,199, mailed Oct. 19, 2015, 5 pages.
International Preliminary Report on Patentability for PCT/US2014/030431, mailed Sep. 24, 2015, 10 pages.
Final Office Action for U.S. Appl. No. 14/218,953, mailed Jan. 4, 2016, 11 pages.
Non-Final Office Action for U.S. Appl. No. 14/555,053, mailed Dec. 31, 2015, 5 pages.

* cited by examiner

RF POWER AMPLIFIER WITH PM FEEDBACK LINEARIZATION

RELATED APPLICATIONS

The present application claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

The present application is related to concurrently filed U.S. patent application Ser. No. 14/215,815, entitled "GAIN AND PHASE CALIBRATION FOR CLOSED LOOP FEEDBACK LINEARIZED AMPLIFIERS"; U.S. patent application Ser. No. 14/217,199, entitled "POWER AMPLIFIER WITH WIDE DYNAMIC RANGE AM FEEDBACK LINEARIZATION SCHEME"; U.S. patent application Ser. No. 14/215,800, entitled "WEAKLY COUPLED BASED HARMONIC REJECTION FILTER FOR FEEDBACK LINEARIZATION POWER AMPLIFIER"; U.S. patent application Ser. No. 14/218,953, entitled "RF POWER AMPLIFIER WITH TOTAL RADIATED POWER STABILIZATION"; U.S. patent application Ser. No. 14/216,376, entitled "AMPLIFIER PHASE DISTORTION CORRECTION BASED ON AMPLITUDE DISTORTION MEASUREMENT"; and U.S. patent application Ser. No. 14/216,560, entitled "RF REPLICATOR FOR ACCURATE MODULATED AMPLITUDE AND PHASE MEASUREMENT".

All of the applications listed above are hereby incorporated herein by reference in their entireties.

FIELD OF THE DISCLOSURE

Embodiments of the present disclosure relate to radio frequency (RF) communications systems, which may include an RF amplification device, an integrated circuit (IC) package, upstream RF system circuitry, downstream RF system circuitry, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, efficient, and conforms to increasingly restrictive performance requirements.

SUMMARY

Circuitry, which includes a package interface, an RF amplification circuit, and a closed-loop phase linearization circuit, is disclosed according to one embodiment of the present disclosure. The package interface receives an RF signal and provides an amplified RF signal. The RF amplification circuit amplifies the RF signal to generate the amplified RF signal, such that an intermediate RF signal is generated during amplification of the RF signal. The closed-loop phase linearization circuit endogenously establishes a target phase of the amplified RF signal using the RF signal. Further, the closed-loop phase linearization circuit applies a phase-shift to the intermediate RF signal based on a difference between the target phase and a measured phase, which is representative of a phase of the amplified RF signal, wherein the phase-shift reduces phase distortion in the amplified RF signal.

In one embodiment of the RF amplification circuit, an overall phase response of the RF amplification circuit manifests itself as a phase difference between the RF signal and the amplified RF signal. The overall phase response may include the phase distortion, a static phase response of the RF amplification circuit, a phase-drift of the RF amplification circuit, or any combination thereof. The static phase response manifests itself as a constant phase difference between the RF signal and the amplified RF signal. The phase-drift manifests itself as relatively slow changes in the phase difference between the RF signal and the amplified RF signal. The phase-drift may be caused by temperature variations of the RF amplification circuit, other environmental variations of the RF amplification circuit, Voltage Standing Wave Ratio (VSWR) variations presented to an output from the RF amplification circuit, the like, or any combination thereof.

In one embodiment of the RF amplification circuit, the phase distortion in the RF amplification circuit manifests itself as relatively fast changes in the phase difference between the RF signal and the amplified RF signal. The phase distortion may be caused by phase modulation (PM) of the RF signal, amplitude modulation (AM) of the RF signal, other fast changes in the RF amplification circuit, or any combination thereof. Phase distortion caused by PM of the RF signal is called PM-PM distortion and phase distortion caused by AM of the RF signal is called AM-PM distortion.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
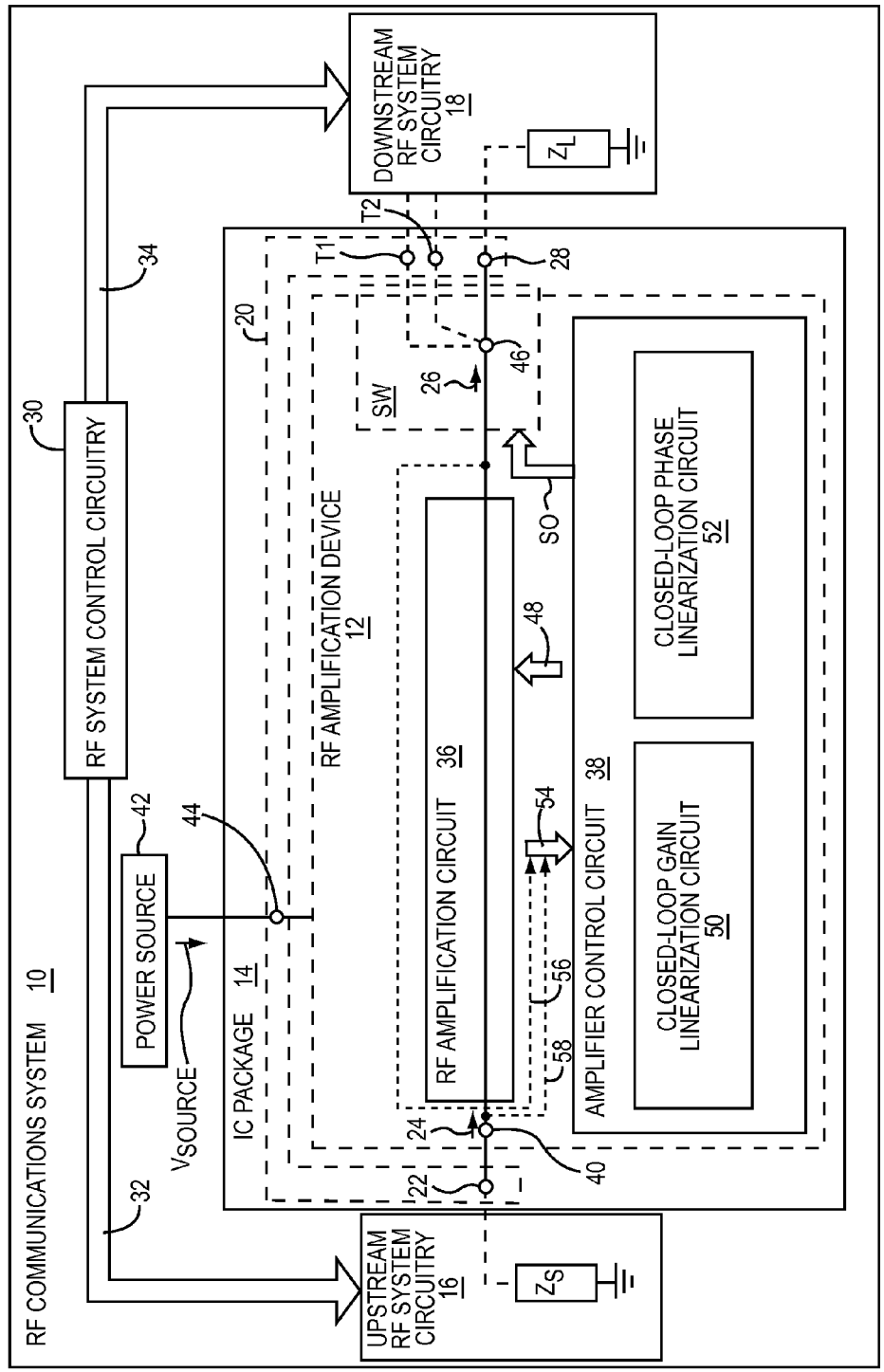
FIG. 1 illustrates a block diagram of one embodiment of an RF communications system.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship between one element, layer, or region and another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that when used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived from and/or originating internally within an electronic component. For example, a setpoint for a closed-loop circuit is established endogenously by the closed-loop circuit if the setpoint is derived from and/or originates internally within the closed-loop circuit. In contrast, with regard to the term "exogenous," exogenous refers to a signal, parameter, or action being derived from and/or originating externally to the electronic component. For example, the setpoint for a closed-loop circuit is established exogenously with respect to the closed-loop circuit if the setpoint is derived from and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to radio frequency (RF) communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include exemplary circuits and circuit elements. To further elucidate these innovative concepts and techniques, the exemplary RF amplification devices are sometimes described as being employed within certain types of RF communications systems. It should be noted that the scope of this disclosure is not limited to the exemplary RF amplification devices, circuits, circuit components, and RF communications systems specifically described herein. Rather, the scope of this disclosure extends to any and all systems, devices, circuits, circuit components, and methods (whether described explicitly or implicitly) in accord with the innovative concepts and techniques described in this disclosure.

The innovative concepts and techniques described herein can be used to amplify an RF signal with greater power efficiency and/or while introducing less distortion. While not required, the exemplary RF amplification devices may thus be used to amplify RF signals provided within various RF communication bands and/or formatted in accordance with various RF communication standards in order to allow for wideband amplification operations. However, the exemplary RF amplification devices described may be implemented to operate with increased autonomy and thus provide wide-band amplification operations with less or no support from other components within the RF communications system. The exemplary RF amplification devices can thus be easily provided within the RF communications system without requiring major customization and/or coordination with other system devices.

Circuitry, which includes a package interface, an RF amplification circuit, and a closed-loop phase linearization circuit, is disclosed according to one embodiment of the present disclosure. The package interface receives an RF signal and provides an amplified RF signal. The RF amplification circuit amplifies the RF signal to generate the amplified RF signal, such that an intermediate RF signal is generated during amplification of the RF signal. The closed-loop phase linearization circuit endogenously establishes a target phase of the amplified RF signal using the RF signal. Further, the closed-loop phase linearization circuit applies a phase-shift to the intermediate RF signal based on a difference between the target phase and a measured phase, which is representative of a phase of the amplified RF signal, wherein the phase-shift reduces phase distortion in the amplified RF signal.

In one embodiment of the RF amplification circuit, an overall phase response of the RF amplification circuit manifests itself as a phase difference between the RF signal and the amplified RF signal. The overall phase response may include the phase distortion, a static phase response of the RF amplification circuit, a phase-drift of the RF amplification circuit, or any combination thereof. The static phase response manifests itself as a constant phase difference between the RF signal and the amplified RF signal. The phase-drift manifests itself as relatively slow changes in the phase difference between the RF signal and the amplified RF signal. The phase-drift may be caused by temperature variations of the RF amplification circuit, other environmental variations of the RF amplification circuit, Voltage Standing Wave Ratio (VSWR) variations presented to an output from the RF amplification circuit, the like, or any combination thereof.

In one embodiment of the RF amplification circuit, the phase distortion in the RF amplification circuit manifests itself as relatively fast changes in the phase difference between the RF signal and the amplified RF signal. The phase distortion may be caused by phase modulation (PM) of the RF signal, amplitude modulation (AM) of the RF signal, other fast changes in the RF amplification circuit, or any combination thereof. Phase distortion caused by PM of the RF signal is called PM-PM distortion and phase distortion caused by AM of the RF signal is called AM-PM distortion.

FIG. 1 illustrates a block diagram of one embodiment of an RF communications system 10. The RF communications system 10 may be any type of communications system capable of transmitting and/or receiving wireless communications signals. For example, the RF communications system 10 may be provided as an RF front-end module in a portable computing device (e.g., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receiver chains within the RF communications system 10. The IC package 14 houses the RF amplification device 12 and allows the RF amplification device 12 to transmit and receive signals within the RF communications system 10 and externally to the IC package 14. More specifically, the IC package 14 includes a package interface 20 configured to connect the RF amplification device 12 to external circuitry within the RF communications system 10.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and the downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14, and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance $Z_S$ at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 so as to generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance $Z_L$ at the second package terminus 28. Since this example presumes that the downstream RF system circuitry 18 is part of one or more transmit chains, the downstream RF system circuitry 18 includes the antenna of the RF communications system 10 along with an antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which is external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. The system control output 32 is received by the upstream RF system circuitry 16 in order to regulate its performance. Similarly, the system control output 34 is received by the downstream RF system circuitry 18 in order to regulate its performance. For example, the system control output 34 may tune the antenna tuner within the downstream RF system circuitry 18 and vary the load impedance $Z_L$. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with greater autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include a 2G Global System for Mobile Communications (GSM) standard (e.g., a Digital Communication System (DCS) specification or a Personal Communications Service (PCS) specification), GSM specifications, Enhanced Data Rates for GSM Evolution (EDGE) specifications of the 3G standard, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access (CDMA) multiplexing, Orthogonal Frequency Division Multiple Access (OFDMA) multiplexing, LTE diversity techniques, Multiple-Input and Multiple-Output (MIMO) techniques, and/or the like.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage $V_{SOURCE}$ is generated by a power source 42 and provided to the RF amplification device 12 at a third package terminus 44 in the package interface 20. The source voltage $V_{SOURCE}$ powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage $V_{SOURCE}$ to the RF signal 24, thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of a plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single RF amplification stage. Other circuitry may be provided in the RF amplification circuit 36 in order to provide matching and/or to provide filtering so that undesired harmonics are reduced. The RF amplification circuit 36 is configured to amplify the RF signal 24 so as to generate the amplified RF signal 26 in accordance with a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna tuners (not shown) and antennas (not shown) in the downstream RF system circuitry 18, which may each be designed for a particular or for a particular combination of RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW may include any number of additional throw ports, such as additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals; RF power converters (i.e., Low-Drop Out regulators, RF switching converters, charge pumps, or the like, or any combination thereof) that generate one or more supply voltages from the source voltage $V_{SOURCE}$ to power the RF amplification circuit 36; phase shifting components; and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. Both the closed-loop gain linearization circuit 50 and the closed-loop phase linearization circuit 52 are configured to increase linearization of a response characteristic defined by the transfer function of the RF amplification circuit 36. More specifically, with regard to the closed-loop gain linearization circuit 50, the response characteristic is a gain defined by the transfer function of the RF amplification circuit 36. Accordingly, the closed-loop gain linearization circuit 50 is configured to increase linearization of the gain of the RF amplification circuit 36. With regard to the closed-loop phase linearization circuit 52, the response characteristic is a phase-shift defined by the transfer function of the RF amplification circuit 36. Accordingly, the closed-loop phase linearization circuit 52 is configured to increase linearization of the phase-shift of the RF amplification circuit 36. In some embodiments, the closed-loop gain linearization circuit 50 and the closed-loop phase linearization circuit 52 substantially linearize the gain and the phase-shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry or the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed-loop circuits because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, each of the closed-loop gain linearization circuit 50 and the closed-loop phase linearization circuit 52 endogenously establishes a setpoint of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the setpoints of the closed-loop gain linearization circuit 50 and the closed-loop phase linearization circuit 52. Instead, the closed-loop gain linearization circuit 50 and the closed-loop phase linearization circuit 52 are each configured to establish their respective setpoints endogenously within the IC package 14. As such, the control input 54 includes at least one reference signal 58 that depends on the RF signal 24.

While the closed-loop gain linearization circuit 50 is activated, the transfer function of the RF amplification circuit 36 defines a closed-loop gain response, and while the closed-loop gain linearization circuit 50 is deactivated, the transfer function of the RF amplification circuit 36 defines an open-loop gain response. The setpoint endogenously established by the closed-loop gain linearization circuit 50 is a target amplitude of the amplified RF signal 26. Similarly, while the closed-loop phase linearization circuit 52 is activated, the transfer function of the RF amplification circuit 36 defines a closed-loop phase response, and while the closed-loop phase linearization circuit 52 is deactivated, the transfer function of the RF amplification circuit 36 defines an open-loop phase response. The setpoint endogenously established by the closed-loop phase linearization circuit 52 is a target phase of the amplified RF signal 26. By establishing the setpoints of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide wide-band amplification operations without requiring exogenous control signals from the RF communications system 10 to establish setpoints.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
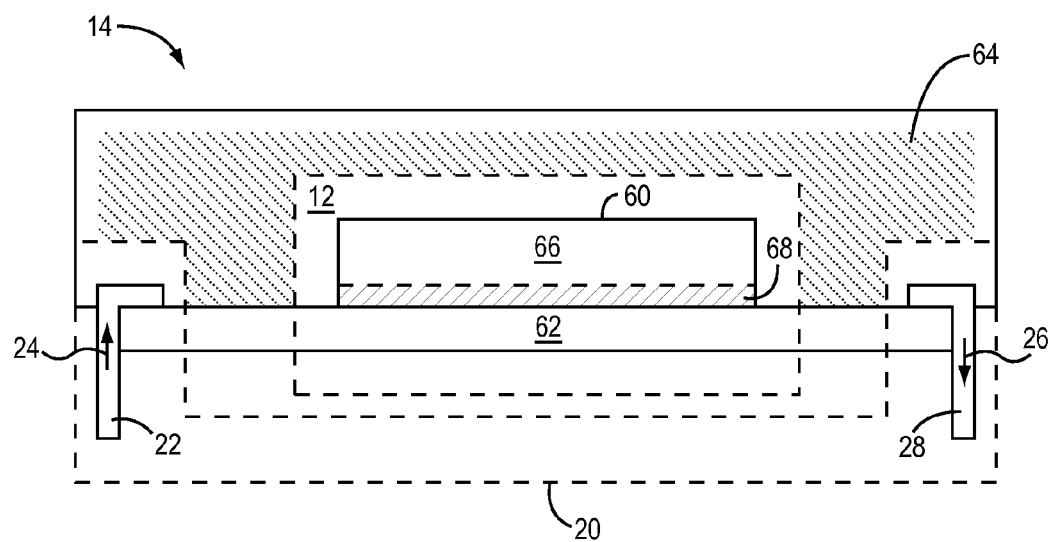
FIG. 2 is a cross-sectional view of an exemplary physical layout of an integrated circuit (IC) package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above with regard to FIG. 1. An IC is formed by the semiconductor die 60. The RF amplification device 12 may be formed partially or entirely by the semiconductor die 60, depending on the application and topology of the RF amplification device 12. In alternative embodiments, the IC package 14 may include multiple semiconductor dies (like the semiconductor die 60) and the RF amplification device 12 may be built on the multiple semiconductor dies. For example, the RF amplification circuit 36 (shown in FIG. 1) and the amplifier control circuit 38 (shown in FIG. 1) may be formed on separate semiconductor dies. Additionally, one or more of RF amplifier stages 36A, 36B, 36C (shown in FIG. 4) may be built on separate semiconductor dies. Furthermore, the closed-loop gain linearization circuit 50 and the closed-loop phase linearization circuit 52 may be built on separate semiconductor dies. These and other combinations would be apparent to one of ordinary skill in the art in light of this disclosure.

With regard to the semiconductor die 60 shown in FIG. 2, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or on a bottom of the semiconductor substrate 66 to provide termini of the active semiconductor components, to form passive impedance elements, and/or the like. The semiconductor die 60 also includes a Back-End-of-Line (BEOL) 68, which may be formed from a non-conductive substrate and a plurality of metallic layers provided on or in a insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance with any suitable semiconductor technology, such as Complementary Metal-On-Oxide Semiconductor (CMOS) technology, Bi-Complementary Metal-On-Oxide Semiconductor (BiCMOS) technology, Silicon-On-Insulator (SOI) technology, and/or the like. In this embodiment, the topology of the semiconductor die 60 is provided in accordance with CMOS technology, since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing wide-band amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide ($SiO_x$). The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The metallic layers of the package board may be used to form termini, passive impedance components, and connections. For instance, the metallic layers may be used to form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an exemplary version of the package interface 20. In this embodiment, the package interface 20 is coupled to the package board 62 so that signals (not shown) can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1, but not in FIG. 2) is also provided as a pin connected to the package board 62. As mentioned above, the RF amplification device 12 may be configured to operate autonomously, and thus the IC package 14 may be a small number of pins. For example, the IC package 14 may have fewer than eleven (11) pins. In this embodiment, the IC package 14 has a total of eight (8) pins, including a grounding terminus.

Figure 3:
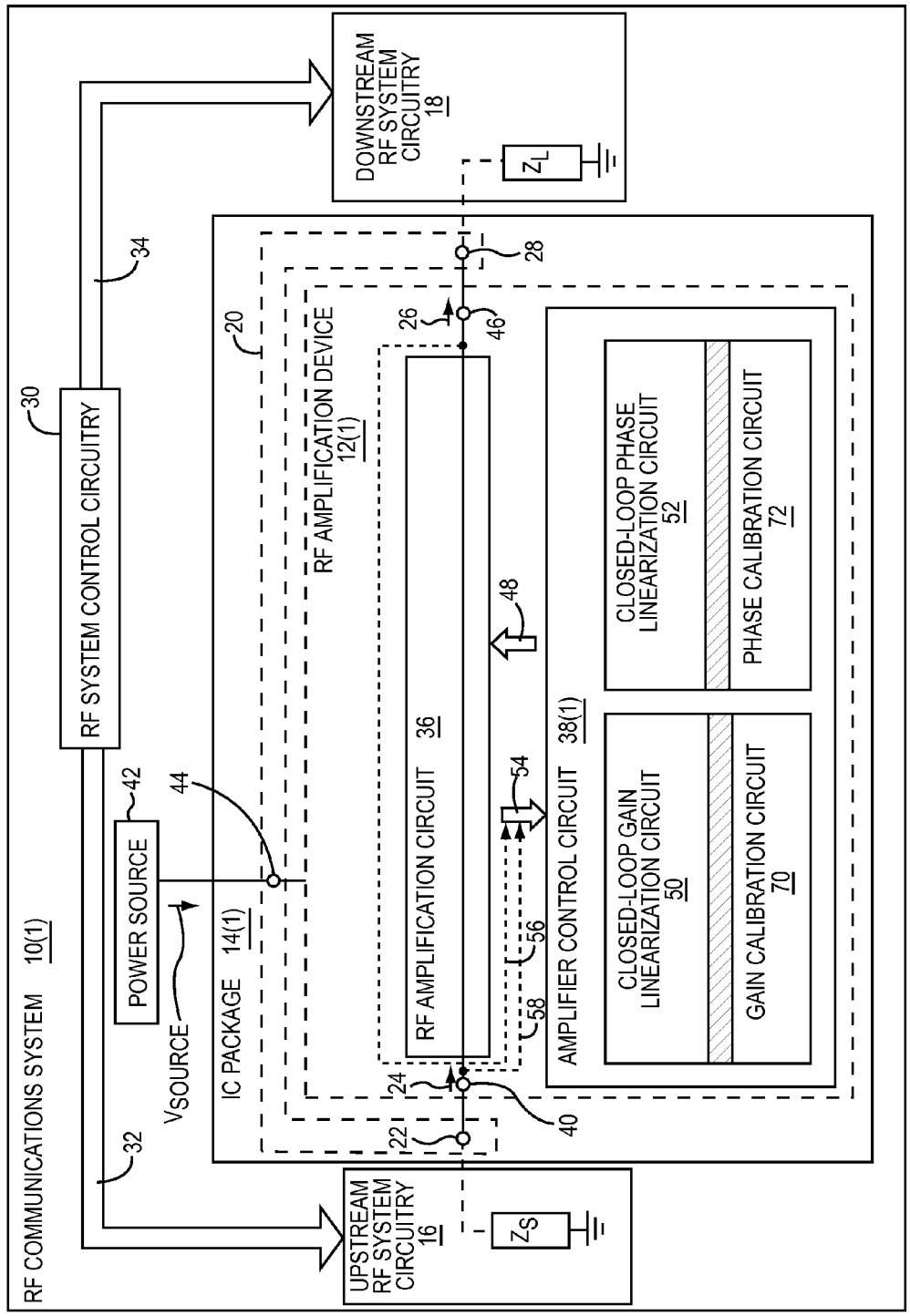
FIG. 3 is a block diagram of another exemplary RF communications system, an RF amplification device, and an IC package housing the RF amplification device, which are embodiments of the RF communications system, the RF amplification device, and the IC package shown in FIG. 1.

Referring now to FIG. 3, FIG. 3 is a block diagram of another exemplary RF communications system 10(1), an RF amplification device 12(1), and an IC package 14(1) housing the RF amplification device 12(1), which are embodiments of the RF communications system 10, the RF amplification device 12, and the IC package 14 described above with respect to FIG. 1. The RF amplification device 12(1) also includes the RF amplification circuit 36 described above with respect to FIG. 1, along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further detail below, at small-signal power levels, the closed-loop gain linearization circuit 50 may be deactivated, and thus the RF amplification circuit 36 may amplify the RF signal 24 in accordance with the open-loop gain response defined by the transfer function of the RF amplification circuit 36. At these small-signal power levels when the closed-loop gain linearization circuit 50 is deactivated, the open-loop gain response may be substantially linear. As discussed above, while the closed-loop gain linearization circuit 50 is activated, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another (and thus share components) or may be independent (and thus not share components). As explained further below, at small-signal power levels, the closed-loop phase linearization circuit 52 may be deactivated, and thus the RF amplification circuit 36 may amplify the RF signal 24 in accordance with the open-loop phase response defined by the transfer function of the RF amplification circuit 36. At these small-signal power levels when the closed-loop phase linearization circuit 52 is deactivated, the open-loop phase response may be substantially linear. As discussed above, while the closed-loop phase linearization circuit 52 is activated, the closed-loop phase response defined by the transfer function is also linear. However, without the phase calibration circuit 72, the phase-shift of the RF amplification circuit 36 may be different during the closed-loop phase response and the open-loop phase response. The phase calibration circuit 72 is configured to reduce a difference between the closed-loop phase response and the open-loop phase response. For example, the phase calibration circuit 72 may be configured to substantially eliminate the difference between the closed-loop phase response and the open-loop phase response. Accordingly, the phase-shift of the RF amplification circuit 36 may be substantially the same during the closed-loop phase response and the open-loop phase response.

Figure 4:
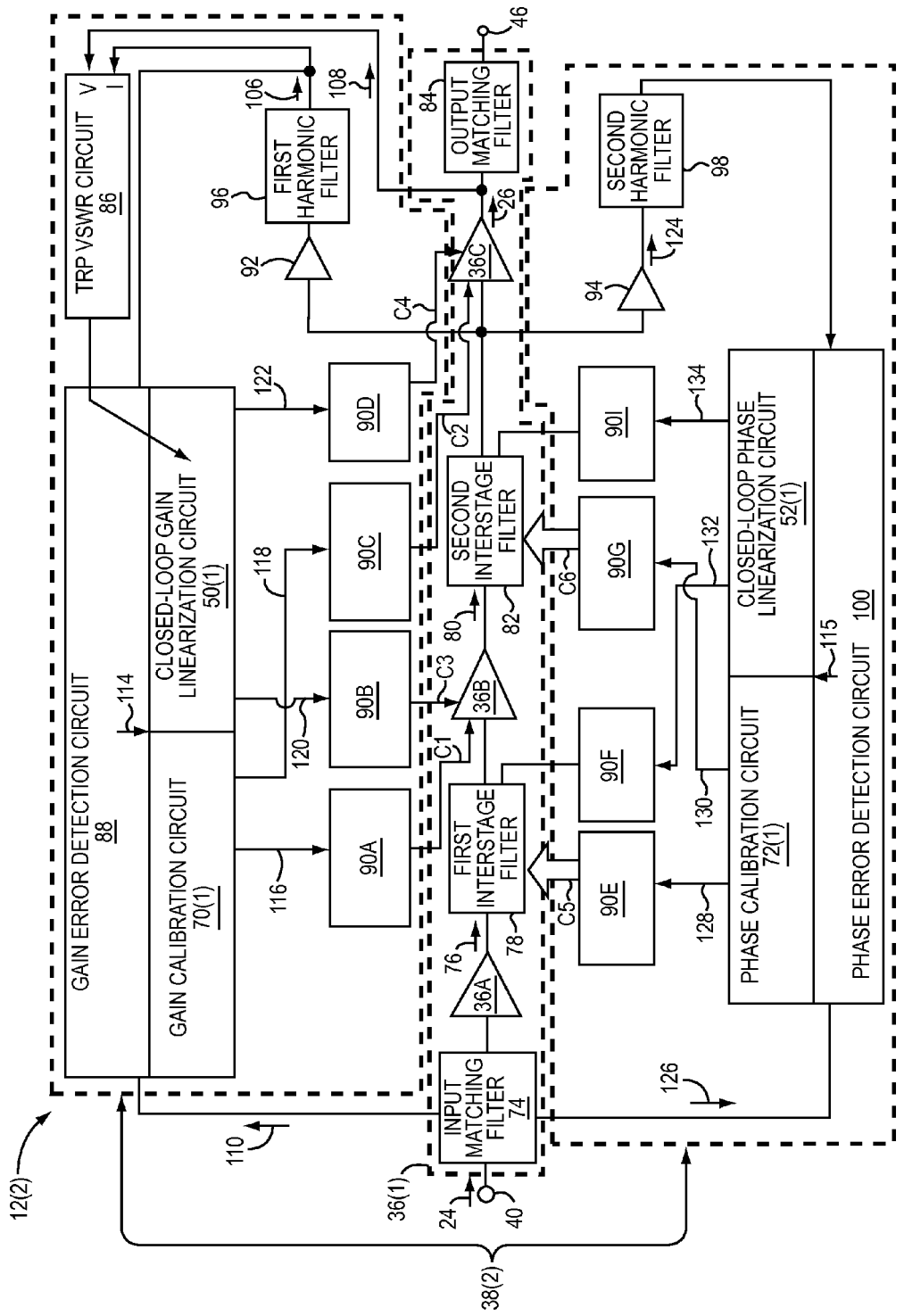
FIG. 4 illustrates a block diagram of another embodiment of an RF amplification device, which is a more detailed example of the RF amplification device shown in FIG. 1.

FIG. 4 illustrates a block diagram of another embodiment of an RF amplification device 12(2), which is a more detailed example of the RF amplification device 12 shown in FIG. 1. The RF amplification device 12(2) includes an embodiment of an RF amplification circuit 36(1) and an embodiment of an amplifier control circuit 38(2). The RF amplification circuit 36(1) is one embodiment of the RF amplification circuit 36 described above with regard to FIG. 1. However, in this embodiment, the RF amplification circuit 36(1) includes the plurality of RF amplifier stages 36A, 36B, 36C coupled in cascade. Accordingly, each of the plurality of RF amplifier stages 36A, 36B, 36C is operable to provide amplification, and by being coupled in cascade, the RF amplifier stages 36A, 36B, 36C provide amplification to the RF signal 24 in sequence.

The RF amplification circuit 36(1) shown in FIG. 4 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance $Z_S$ (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain $G_{initial}$. A first interstage filter 78 is coupled between the initial RF amplifier stage 36A and the intermediate RF amplifier stage 36B. The first interstage filter 78 is configured to filter undesired harmonics from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain $G_{intermediate}$. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage RF signal 80. The final RF amplifier stage 36C is configured to amplify the second interstage RF signal 80 so as to generate the amplified RF signal 26 in accordance with an amplifier gain $G_{final}$. As such, the gain of the RF amplification circuit 36(1) may be described as $G_{initial}*G_{intermediate}*G_{final}$. An output matching filter 84 is coupled to the final RF amplifier stage 36C so as to receive the amplified RF signal 26. The output matching filter 84 is configured to substantially match an output impedance of the RF amplification circuit 36(1) to the load impedance $Z_L$ (shown in FIG. 1) of the downstream RF system circuitry 18 (shown in FIG. 1).

The amplifier gain $G_{initial}$, the amplifier gain $G_{intermediate}$, and the amplifier gain $G_{final}$ may each be any type of amplifier gain (e.g., a voltage gain, a transconductance gain, a transresistance gain, or a current gain) depending on the topology of each of the corresponding RF amplifier stages 36A, 36B,

36C. For example, the amplifier gain $G_{initial}$, the amplifier gain $G_{intermediate}$, and the amplifier gain $G_{final}$ may each be the same type of amplifier gain or may each be a different type of amplifier gain. As such, the gain of the RF amplification circuit 36(1) may be any type of amplifier gain, depending on a combination of the types of the amplifier gain $G_{initial}$, the amplifier gain $G_{intermediate}$, and the amplifier gain $G_{final}$ provided by each of the RF amplifier stages 36A, 36B, 36C.

Note that as amplification progresses through the sequence of the RF amplifier stages 36A, 36B, 36C, each of the RF amplifier stages 36A, 36B, 36C handles an increasing amount of power. Therefore, the initial RF amplifier stage 36A handles the least amount of power, since it receives the RF signal 24 prior to amplification and transmits the first interstage RF signal 76 amplified only in accordance with the amplifier gain $G_{initial}$. In one embodiment, the amplifier gain $G_{initial}$ is a voltage gain. Thus, the initial RF amplifier stage 36A amplifies the RF signal 24 such that the amplifier gain $G_{initial}$ approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain $G_{initial}$. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain $G_{initial}*G_{intermediate}$. As a result, the intermediate RF amplifier stage 36B handles an intermediate amount of power. In one embodiment, the amplifier gain $G_{intermediate}$ is a transconductance gain. Thus, the intermediate RF amplifier stage 36B amplifies the first interstage RF signal 76 such that the amplifier gain $G_{intermediate}$ approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain $G_{initial}*G_{intermediate}$. As such, the final RF amplifier stage 36C further amplifies the second interstage RF signal 80 so as to generate the amplified RF signal 26. In one embodiment, the amplifier gain $G_{final}$ is a current gain. Thus, the final RF amplifier stage 36C amplifies the second interstage RF signal 80 such that the amplifier gain $G_{final}$ approximately describes a proportion between a current level of the amplified RF signal 26 and the current level of the second interstage RF signal 80. The final RF amplifier stage 36C thus transmits the amplified RF signal 26 amplified in accordance with the (total) gain ($G_{initial}*G_{intermediate}*G_{final}$) of the RF amplification circuit 36(1). As such, the final RF amplifier stage 36C handles the most power. Furthermore, the (total) gain of the RF amplification circuit 36(1) is a transconductance gain.

FIG. 4 also illustrates the amplifier control circuit 38(2) used to regulate the RF amplification circuit 36(1). The amplifier control circuit 38(2) includes a closed-loop gain linearization circuit 50(1), a closed-loop phase linearization circuit 52(1), a gain calibration circuit 70(1), and a phase calibration circuit 72(1), which are embodiments of the closed-loop gain linearization circuit 50, the closed-loop phase linearization circuit 52, the gain calibration circuit 70, and the phase calibration circuit 72 described above with respect to FIGS. 1 and 3. The amplifier control circuit 38(2) further includes a Total Radiated Power (TRP) Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 90I, a first final stage replica amplifier 92, a second final stage replica amplifier 94, a first harmonic filter 96, a second harmonic filter 98, and a phase error detection circuit 100.

The TRP VSWR circuit 86 is a feed-forward linearization circuit configured to make a VSWR measurement and adjust a feedback gain of the closed-loop gain linearization circuit 50(1) in accordance with the VSWR measurement. For example, the TRP VSWR circuit 86 may be configured to adjust the feedback gain of the closed-loop gain linearization circuit 50(1) in accordance with the VSWR measurement so as to maintain an output power level of the amplified RF signal 26 substantially constant. The TRP VSWR circuit 86 may be configured to adjust the feedback gain of the closed-loop gain linearization circuit 50(1) in accordance with the VSWR measurement so as to maintain the closed-loop gain linearization circuit 50(1) out of unstable control regions. In order to make the VSWR measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement using the first feedback signal 106 and the second feedback signal 108.

In this embodiment, the closed-loop gain linearization circuit 50(1) and the gain calibration circuit 70(1) are partially amalgamated, since the closed-loop gain linearization circuit 50(1) and the gain calibration circuit 70(1) share the gain error detection circuit 88. Alternatively, the closed-loop gain linearization circuit 50(1) and the gain calibration circuit 70(1) may each have independent error detection circuits (like the gain error detection circuit 88), and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the setpoint of the closed-loop gain linearization circuit 50(1), which is indicative of a target power level of the amplified RF signal 26. By having the TRP VSWR circuit 86 adjust the feedback gain based on the VSWR measurement and using the first feedback signal 106, the gain error detection circuit 88 is configured to provide feedback indicative of a current power level of the amplified RF signal 26. The gain error detection circuit 88 is configured to compare the feedback and the setpoint to generate a gain error signal 114 having an error signal level indicative of a power level error between the feedback and the setpoint.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points, as explained in further detail below. In this embodiment, the gain calibration circuit 70(1) is operably associated with the driver stage gain control block 90A and the final stage gain control block 90C. The gain calibration circuit 70(1) is configured to generate a first gain calibration signal 116, which is received by the driver stage gain control block 90A, and a second gain calibration signal 118, which is received by the final stage gain control block 90C. The driver stage gain control block 90A is configured to generate a control signal C1 that sets the gain of the intermediate RF amplifier stage 36B, while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is a driver biasing circuit and the control signal C1 is a bias signal that sets a quiescent operating level of the intermediate RF amplifier stage 36B. Additionally, the final stage gain control block 90C is a final stage biasing circuit and the control signal C2 is a bias signal that sets a quiescent operating level of the final RF amplifier stage 36C.

With regard to the closed-loop gain linearization circuit 50(1), the closed-loop gain linearization circuit 50(1) is configured to adjust the gain of the RF amplification circuit 36(1) in accordance with the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120, which is received by the driver stage gain control block 90B, and a second gain control signal 122, which is received by the final stage gain control block 90D. The driver stage gain control block 90B is configured to generate a control signal C3 that sets the gain of the intermediate RF amplifier stage 36B, while the final stage gain control block 90D is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D, and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is a low pass filter and the control signal C3 is an impedance control signal that sets an internal impedance level of the intermediate RF amplifier stage 36B. Additionally, the final stage gain control block 90D is a low pass filter and the control signal C4 is an impedance control signal that sets an internal impedance level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share the phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the setpoint of the closed-loop phase linearization circuit 52(1), which is indicative of a target phase-shift of the RF amplification circuit 36(1). The phase error detection circuit 100 is also configured to measure the phase-shift of the RF amplification circuit 36(1) using the third feedback signal 124 as feedback. The phase error detection circuit 100 generates a phase error signal 115 having an error signal level indicative of a phase-shift error between the feedback and the setpoint.

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points, as explained in further detail below. In this embodiment, the phase calibration circuit 72(1) is operably associated with the driver stage phase control block 90E and the final stage phase control block 90O. The phase calibration circuit 72(1) is configured to generate a first phase calibration signal 128 which is received by the driver stage phase control block 90E and a second phase calibration signal 130 which is received by the final stage phase control block 90O. The driver stage phase control block 90E is configured to generate a control output C5 that sets a phase-shift of the intermediate RF amplifier stage 36B, while the final stage phase control block 90O is configured to generate a control output C6 that sets a phase-shift of the final RF amplifier stage 36C. With the first phase calibration signal 128 and the second phase calibration signal 130, the phase calibration circuit 72(1) is configured to control the driver stage phase control block 90E and the final stage phase control block 90O and thereby regulate the phase-shift of the RF amplification circuit 36(1). As explained in further detail below, the phase calibration circuit 72(1) controls the phase-shift of the RF amplification circuit 36(1) in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90O is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase-shift of the RF amplification circuit 36(1) in accordance with the phase error signal 115 while activated so as to maintain the phase-shift of the RF amplification circuit 36(1) relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132, which is received by the driver stage phase control block 90F, and a second phase control signal 134, which is received by the final stage phase control block 90I. The driver stage phase control block 90F is configured to set the phase-shift of the intermediate RF amplifier stage 36B using the first phase control signal 132, while the final stage phase control block 90I is configured to set the phase-shift of the final RF amplifier stage 36C using the second phase control signal 134. In this manner, the closed-loop phase linearization circuit 52(1) is configured to control the phase-shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor, and the second phase control signal 134 may be used to set a variable capacitance of the varactor.

To avoid the use of bulky couplers for power detection, the first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80, just like the final RF amplifier stage 36C. The first final stage replica amplifier 92 is configured to generate the first feedback signal 106 such that the first feedback signal level is a scaled-down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80, just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100.

Figure 5:
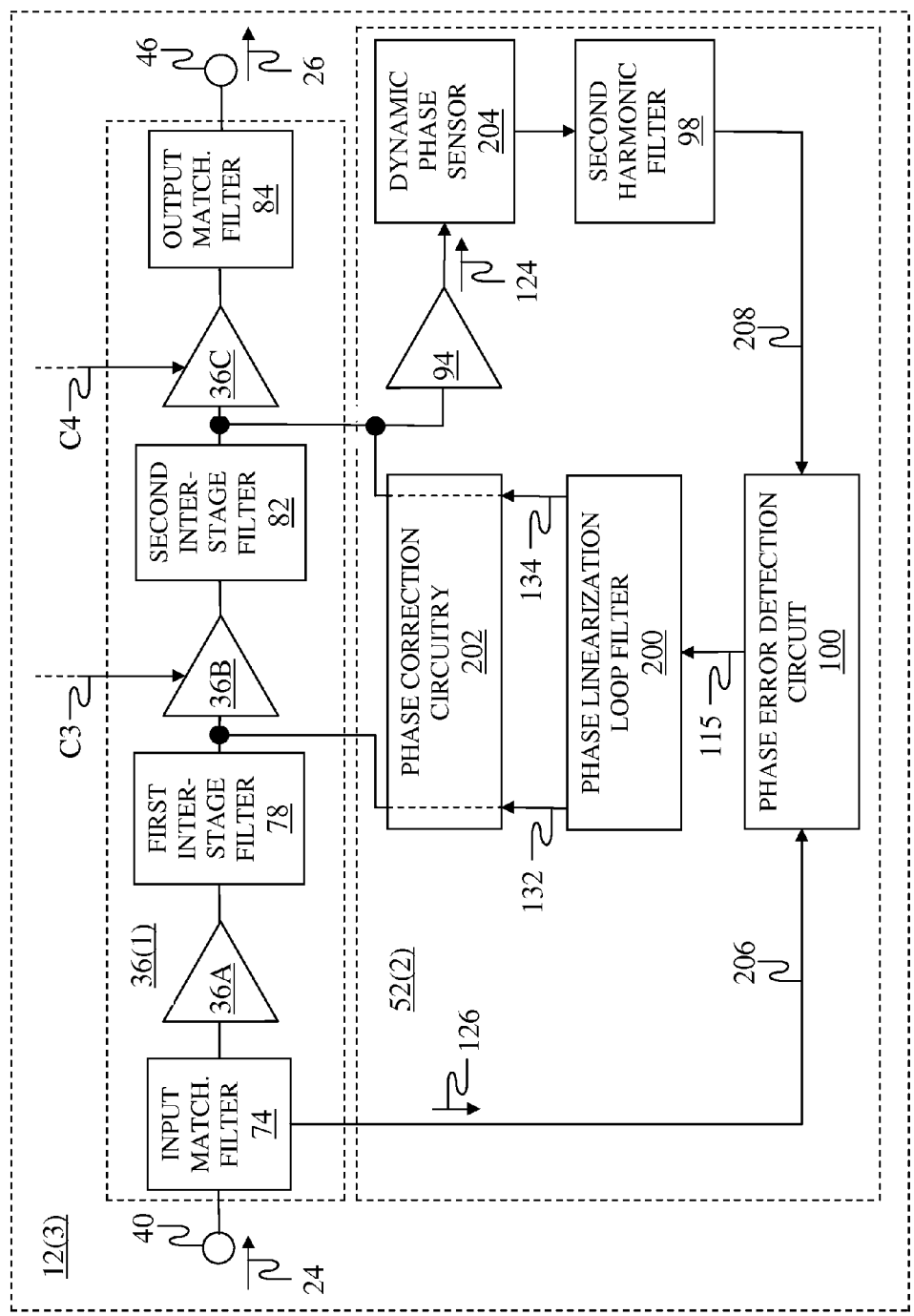
FIG. 5 illustrates details of a partial embodiment of the RF amplification device shown in FIG. 1 according to one embodiment of the RF amplification device.

FIG. 5 illustrates details of a partial embodiment of the RF amplification device 12 shown in FIG. 1 according to one embodiment of the RF amplification device 12. The embodiment of the RF amplification device 12(3) illustrated in FIG. 5 includes one embodiment of the RF amplification circuit 36(1) and one embodiment of the closed-loop phase linearization circuit 52(2). The RF amplification circuit 36(1) illustrated in FIG. 5 is similar to the RF amplification circuit 36(1) illustrated in FIG. 4. The closed-loop phase linearization circuit 52(2) illustrated in FIG. 5 shows details of the closed-loop phase linearization circuits 52, 52(1) illustrated in FIGS. 1 and 4, respectively.

The RF amplification circuit 36(1) includes the initial RF amplifier stage 36A, the intermediate RF amplifier stage 36B, the final RF amplifier stage 36C, the input matching filter 74, the first interstage filter 78, the second interstage filter 82, and the output matching filter 84. The initial RF amplifier stage 36A, the intermediate RF amplifier stage 36B, the final RF amplifier stage 36C, the input matching filter 74, the first interstage filter 78, the second interstage filter 82, and the output matching filter 84 are coupled in series between the input terminus 40 and the output terminus 46 to form an amplifier chain. In general, the initial RF amplifier stage 36A, the intermediate RF amplifier stage 36B, and the final RF amplifier stage 36C are coupled in series between the input terminus 40 and the output terminus 46.

Specifically, the input matching filter 74 is coupled between the input terminus 40 and the initial RF amplifier stage 36A. The first interstage filter 78 is coupled between the initial RF amplifier stage 36A and the intermediate RF amplifier stage 36B. The second interstage filter 82 is coupled between the intermediate RF amplifier stage 36B and the final RF amplifier stage 36C. The output matching filter 84 is coupled between the final RF amplifier stage 36C and the output terminus 46. The amplified RF signal 26 is based on the final RF amplifier stage 36C.

The closed-loop phase linearization circuit 52(2) includes the second final stage replica amplifier 94, the second harmonic filter 98, the phase error detection circuit 100, a phase linearization loop filter 200, phase correction circuitry 202, and a dynamic phase sensor 204. The input matching filter 74 provides the second reference signal 126 to the phase error detection circuit 100. As such, the second reference signal 126 is a phase reference signal 206. In one embodiment of the phase reference signal 206, the phase reference signal 206 has low distortion, such that the phase reference signal 206 is a low distortion phase reference signal. The second final stage replica amplifier 94 is coupled to the final RF amplifier stage 36C. As such, the second final stage replica amplifier 94 approximately replicates the final RF amplifier stage 36C to provide the third feedback signal 124. In one embodiment of the second final stage replica amplifier 94, the second final stage replica amplifier 94 replicates an output current from the final RF amplifier stage 36C.

Therefore, a phase response in the final RF amplifier stage 36C is approximately replicated in the second final stage replica amplifier 94. However, loading effects presented to an output of the final RF amplifier stage 36C may be avoided by using the second final stage replica amplifier 94. Such effects may include VSWR variations at the output of the final RF amplifier stage 36C. Therefore, using the second final stage replica amplifier 94 may at least partially reject VSWR variations from the third feedback signal 124. In this regard, a phase of the third feedback signal 124 is representative of a phase of the amplified RF signal 26 and is also representative of the phase distortion.

The dynamic phase sensor 204 is coupled between an output from the second final stage replica amplifier 94 and the second harmonic filter 98. The second harmonic filter 98 is coupled between the dynamic phase sensor 204 and the phase error detection circuit 100. In general, the second harmonic filter 98 and the dynamic phase sensor 204 are coupled in series between the output from the second final stage replica amplifier 94 and the phase error detection circuit 100. The second harmonic filter 98 is a harmonic rejection filter to substantially remove harmonics of the RF signal 24. By removing the harmonics of the RF signal 24, the closed-loop phase linearization circuit 52(2) is focused on a fundamental frequency of the RF signal 24.

In one embodiment of the RF amplification circuit 36(1), an intermediate RF signal is between the input matching filter 74 and the initial RF amplifier stage 36A. In an alternate embodiment of the RF amplification circuit 36(1), the intermediate RF signal is between the first interstage filter 78 and the intermediate RF amplifier stage 36B. In an additional embodiment of the RF amplification circuit 36(1), the intermediate RF signal is between the second interstage filter 82 and the final RF amplifier stage 36C.

In one embodiment of the RF amplification circuit 36(1), a group of intermediate RF signals has a first intermediate RF signal and a second intermediate RF signal, such that the first intermediate RF signal is between the input matching filter 74 and the initial RF amplifier stage 36A, and the second intermediate RF signal is between the first interstage filter 78 and the intermediate RF amplifier stage 36B. In an additional embodiment of the RF amplification circuit 36(1), the group of intermediate RF signals has the first intermediate RF signal and the second intermediate RF signal, such that the first intermediate RF signal is between the input matching filter 74 and the initial RF amplifier stage 36A, and the second intermediate RF signal is between the second interstage filter 82 and the final RF amplifier stage 36C.

In an alternate embodiment of the RF amplification circuit 36(1), the group of intermediate RF signals has the first intermediate RF signal and the second intermediate RF signal, such that the first intermediate RF signal is between the first interstage filter 78 and the intermediate RF amplifier stage 36B, and the second intermediate RF signal is between the second interstage filter 82 and the final RF amplifier stage 36C. In a further embodiment of the RF amplification circuit 36(1), the group of intermediate RF signals has the first intermediate RF signal, the second intermediate RF signal, and a third intermediate RF signal, such that the first intermediate RF signal is between the input matching filter 74 and the initial RF amplifier stage 36A, the second intermediate RF signal is between the first interstage filter 78 and the intermediate RF amplifier stage 36B, and the third intermediate RF signal is between the second interstage filter 82 and the final RF amplifier stage 36C.

In one embodiment of the RF amplification circuit 36(1), an overall phase response of the RF amplification circuit 36(1) includes phase distortion of the RF amplification circuit 36(1), a static phase response of the RF amplification circuit 36(1), and a phase-drift of the RF amplification circuit 36(1). In one embodiment of the static phase response of the RF amplification circuit 36(1), a frequency of the static phase response is, by definition, zero. In one embodiment of the phase-drift of the RF amplification circuit 36(1), a frequency of the phase-drift of the RF amplification circuit 36(1) is less than about 100 hertz. In one embodiment of the phase distortion of the RF amplification circuit 36(1), a frequency of the phase distortion of the RF amplification circuit 36(1) is greater than about 100 hertz.

The dynamic phase sensor 204 provides a phase feedback signal 208 via the second harmonic filter 98 by detecting the phase distortion of the RF amplification circuit 36(1) in the amplified RF signal 26. As such, the phase feedback signal 208 is based on the third feedback signal 124. In one embodiment of the dynamic phase sensor 204, the dynamic phase sensor 204 is substantially unresponsive to both the static phase response of the RF amplification circuit 36(1) and the phase-drift of the RF amplification circuit 36(1). In this regard, the dynamic phase sensor 204 isolates the phase distortion.

In one embodiment of the RF communications system 10 (FIG. 1), in general, the package interface 20 (FIG. 1) receives the RF signal 24 and provides the amplified RF signal 26. The RF amplification circuit 36(1) amplifies the RF signal 24 to generate the amplified RF signal 26, such that the intermediate RF signal is generated during amplification of the RF signal 26. The closed-loop phase linearization circuit 52(2) endogenously establishes a target phase of the amplified RF signal 26 using the RF signal 24. As such, in one embodiment of the target phase, the target phase is based on a phase of the RF signal 24. Further, the closed-loop phase linearization circuit 52(2) applies a phase-shift to the intermediate RF signal based on a difference between the target phase and a measured phase, which is representative of a phase of the amplified RF signal 26, wherein the phase-shift reduces phase distortion in the amplified RF signal 26.

In one embodiment of the RF amplification circuit 36(1) and the closed-loop phase linearization circuit 52(2), the group of intermediate RF signals is generated during amplification of the RF signal 24, such that the group of intermediate RF signals includes the intermediate RF signal. Further, the closed-loop phase linearization circuit 52(2) applies a phase-shift to each of the group of intermediate RF signals. In one embodiment of the RF amplification circuit 36(1), the phase distortion in the RF amplification circuit 36(1) is at least partially based on amplitude variations of the RF signal 24.

In one embodiment of the phase error detection circuit 100, the phase error detection circuit 100 receives the phase reference signal 206 and the phase feedback signal 208. The phase reference signal 206 is based on the target phase and the phase feedback signal 208 is based on the measured phase. The phase error detection circuit 100 provides the phase error signal 115 based on a phase difference between the phase reference signal 206 and the phase feedback signal 208. In general, the closed-loop phase linearization circuit 52(2) reduces the phase distortion in the RF amplification circuit 36(1) based on the phase error signal 115.

The phase linearization loop filter 200 receives and filters the phase error signal 115 to provide the first phase control signal 132 and the second phase control signal 134. The phase correction circuitry 202 is coupled to the amplifier chain of the RF amplification circuit 36(1). In general, the phase correction circuitry 202 receives the first phase control signal 132 and the second phase control signal 134 and applies phase corrections to the RF amplification circuit 36(1) based on the first phase control signal 132 and the second phase control signal 134.

Specifically, the phase correction circuitry 202 is coupled to the amplifier chain at an input to the intermediate RF amplifier stage 36B and applies a phase correction at the input to the intermediate RF amplifier stage 36B based on the first phase control signal 132. Similarly, the phase correction circuitry 202 is coupled to the amplifier chain at an input to the final RF amplifier stage 36C and applies a phase correction at the input to the final RF amplifier stage 36C based on the second phase control signal 134. In general, the phase correction circuitry 202 applies phase corrections at multiple points in the amplifier chain. By applying phase corrections at multiple points in the amplifier chain instead of at a single point, noise in the RF amplification circuit 36(1) may be reduced. In this regard, the phase correction circuitry 202 applies a phase-shift to each of the group of intermediate RF signals, such that the intermediate RF signal of the group of intermediate RF signals is between the first interstage filter 78 and the intermediate RF amplifier stage 36B, and another intermediate RF signal of the group of intermediate RF signals is between the second interstage filter 82 and the final RF amplifier stage 36C.

In one embodiment of the RF amplification circuit 36(1), the RF amplification circuit 36(1) receives the RF signal 24 from the input terminus 40, which is coupled to the package interface 20 (FIG. 1). Further, the RF amplification circuit 36(1) outputs the amplified RF signal 26 from the output terminus 46, which is coupled to the package interface 20 (FIG. 1). Further, the input matching filter 74 is directly coupled to the input terminus 40. In one embodiment of the RF amplification circuit 36(1) and the closed-loop phase linearization circuit 52(2), the phase error detection circuit 100 is directly coupled to the input matching filter 74. Further, the input matching filter 74 provides the phase reference signal 206.

Figure 6:
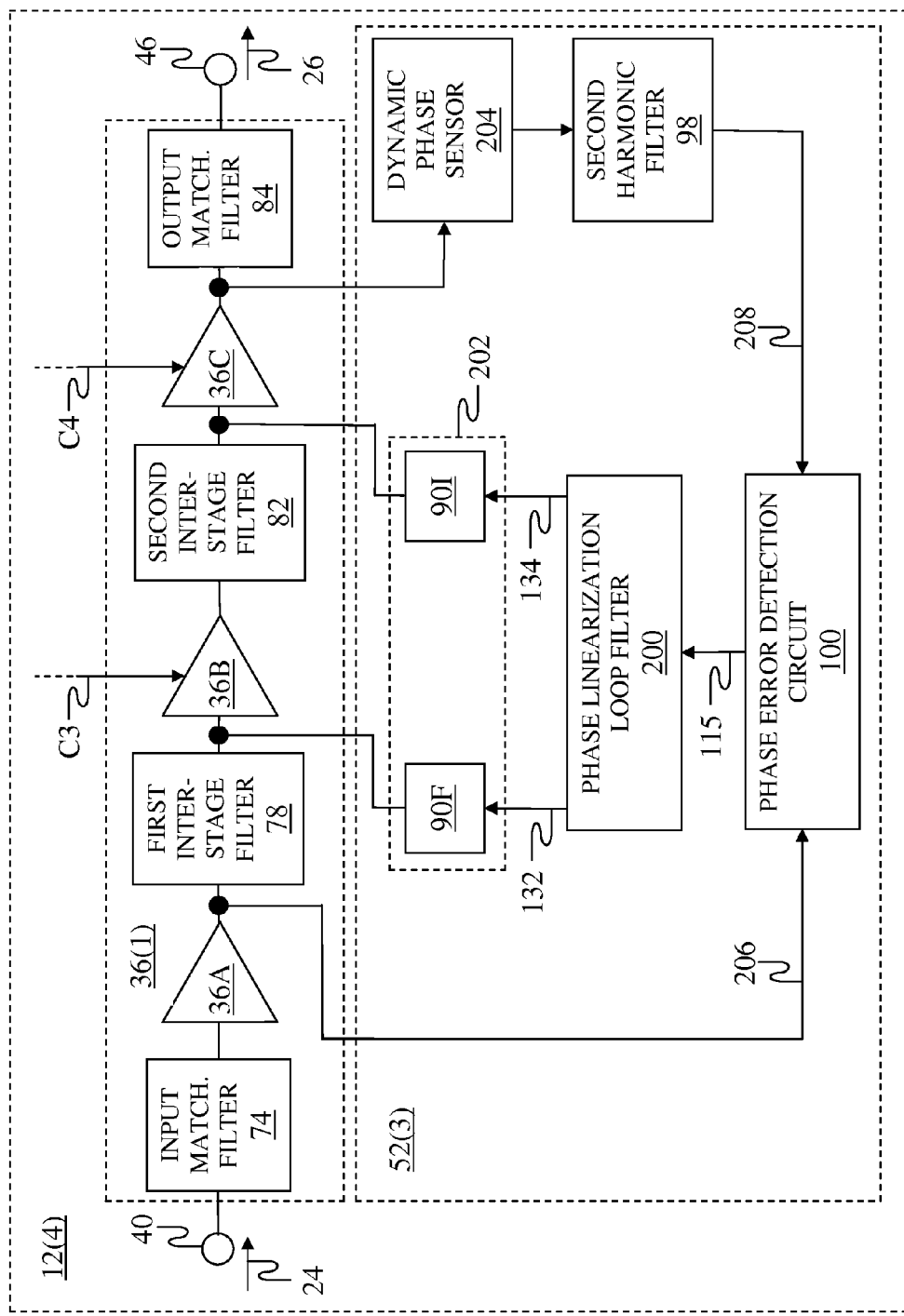
FIG. 6 illustrates details of a partial embodiment of the RF amplification device shown in FIG. 1 according to an alternate embodiment of the RF amplification device.

FIG. 6 illustrates details of a partial embodiment of the RF amplification device 12 shown in FIG. 1 according to an alternate embodiment of the RF amplification device 12. The embodiment of the RF amplification device 12(4) illustrated in FIG. 6 includes one embodiment of the RF amplification circuit 36(1) and one embodiment of the closed-loop phase linearization circuit 52(3). The RF amplification circuit 36(1) illustrated in FIG. 6 is similar to the RF amplification circuit 36(1) illustrated in FIG. 4. The closed-loop phase linearization circuit 52(3) illustrated in FIG. 6 shows details of the closed-loop phase linearization circuits 52, 52(1) illustrated in FIGS. 1 and 4, respectively.

The RF amplification device 12(4) illustrated in FIG. 6 is similar to the RF amplification device 12(3) illustrated in FIG. 5, except in the RF amplification device 12(4) illustrated in FIG. 6, the second final stage replica amplifier 94 is omitted from the closed-loop phase linearization circuit 52(3) and the closed-loop phase linearization circuit 52(3) is coupled to the RF amplification circuit 36(1) in a different manner. Additionally, the phase correction circuitry 202 includes the driver stage phase control block 90F and the final stage phase control block 90I. Specifically, the driver stage phase control block 90F is coupled between the phase linearization loop filter 200 and the intermediate RF amplifier stage 36B. The final stage phase control block 90I is coupled between the phase linearization loop filter 200 and the final RF amplifier stage 36C.

In general, the RF amplification circuit 36(1) includes a group of RF amplifier stages 36A, 36B, 36C and the phase correction circuitry 202 includes a group of control blocks 90F, 90I, such that each of the group of control blocks 90F, 90I is coupled to a corresponding one of the group of RF amplifier stages 36A, 36B, 36C. Further, each of the group of control blocks 90F, 90I receives a corresponding one of a group of phase control signals 132, 134. The group of control blocks 90F, 90I reduces the phase distortion in the RF amplification circuit 36(1) based on the phase error signal 115. Specifically, each of the group of control blocks 90F, 90I applies a phase correction to the RF amplification circuit 36(1) based on a corresponding one of the group of phase control signals 132, 134.

Further, the second harmonic filter 98 and the dynamic phase sensor 204 are coupled in series between the RF amplification circuit 36(1) and the phase error detection circuit 100, such that the phase feedback signal 208 is based on the second harmonic filter 98, the dynamic phase sensor 204, and the RF amplification circuit 36(1).

The RF amplification circuit 36(1) includes the initial RF amplifier stage 36A, such that the phase error detection circuit 100 is directly coupled to an output from the initial RF amplifier stage 36A instead of being coupled to the input matching filter 74. As such, the output from the initial RF amplifier stage 36A provides the phase reference signal 206.

Figure 7:
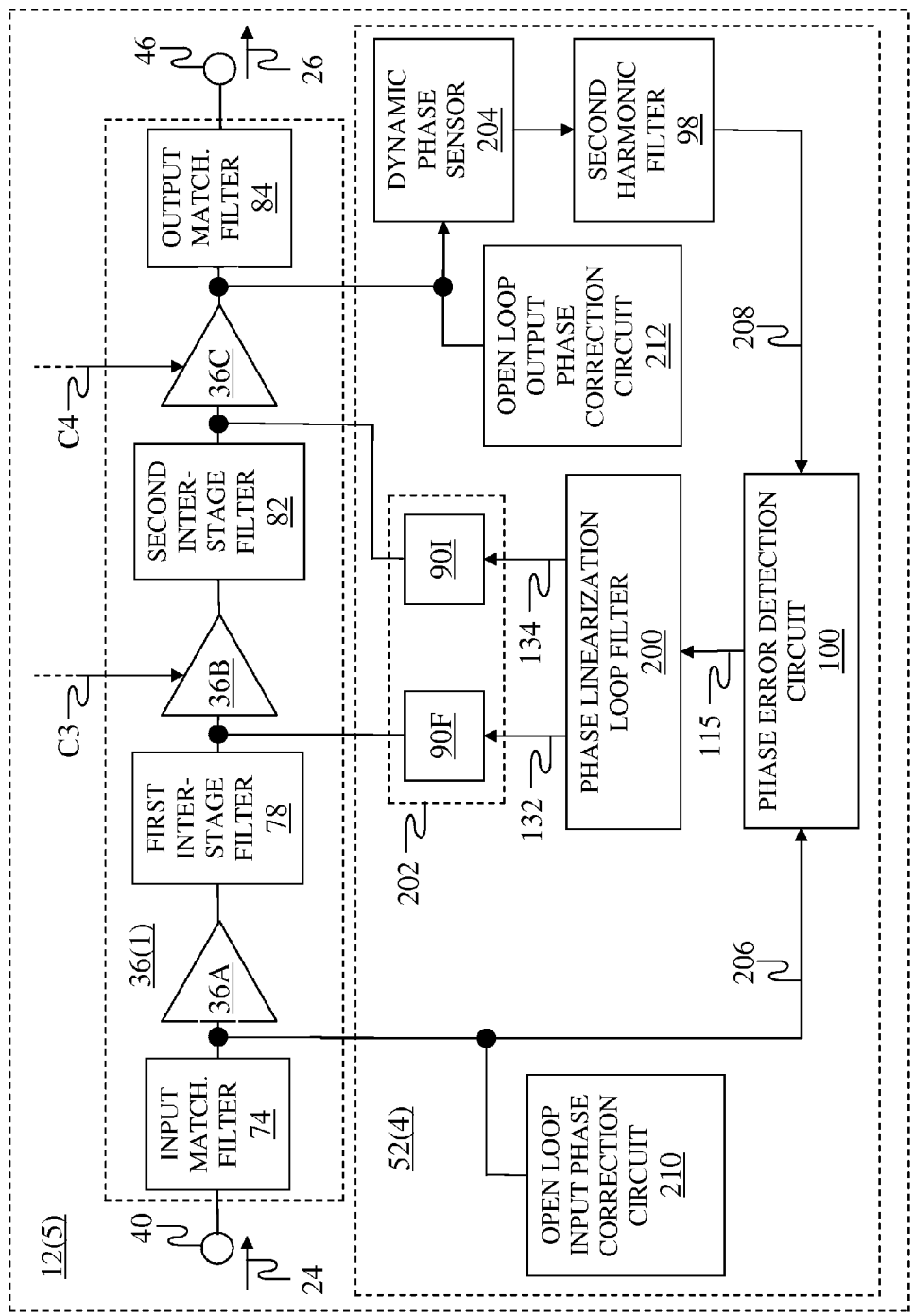
FIG. 7 illustrates details of a partial embodiment of the RF amplification device shown in FIG. 1 according to an additional embodiment of the RF amplification device.

FIG. 7 illustrates details of a partial embodiment of the RF amplification device 12 shown in FIG. 1 according to an additional embodiment of the RF amplification device 12. The embodiment of the RF amplification device 12(5) illustrated in FIG. 7 includes one embodiment of the RF amplification circuit 36(1) and one embodiment of the closed-loop phase linearization circuit 52(4). The RF amplification circuit 36(1) illustrated in FIG. 7 is similar to the RF amplification circuit 36(1) illustrated in FIG. 4. The closed-loop phase linearization circuit 52(4) illustrated in FIG. 7 shows details of the closed-loop phase linearization circuits 52, 52(1) illustrated in FIGS. 1 and 4, respectively.

The RF amplification device 12(5) illustrated in FIG. 7 is similar to the RF amplification device 12(4) illustrated in FIG. 6, except in the RF amplification device 12(5) illustrated in FIG. 7, the closed-loop phase linearization circuit 52(4) further includes an open loop input phase correction circuit 210 and an open loop output phase correction circuit 212. Additionally, the phase error detection circuit 100 is directly coupled to a connection node between the input matching filter 74 and the initial RF amplifier stage 36A instead of being directly coupled to an output from the initial RF amplifier stage 36A. The connection node provides the phase reference signal 206.

In general, a first end of the phase error detection circuit 100 is coupled to the RF amplification circuit 36(1) toward the input terminus 40. A second end of the phase error detection circuit 100 is coupled to the RF amplification circuit 36(1) toward the output terminus 46. The first end of the phase error detection circuit 100 receives the phase reference signal 206. The second end of the phase error detection circuit 100 receives the phase feedback signal 208. The open loop input phase correction circuit 210 is coupled to the first end of the phase error detection circuit 100. The open loop input phase correction circuit 210 provides additional phase correction to the RF amplification circuit 36(1) to further reduce the phase distortion in the RF amplification circuit 36(1).

The open loop output phase correction circuit 212 is coupled to the second end of the phase error detection circuit 100. The open loop output phase correction circuit 212 provides additional phase correction to the RF amplification circuit 36(1) to further reduce the phase distortion in the RF amplification circuit 36(1). In an alternate embodiment of the RF amplification device 12(5), either the open loop input phase correction circuit 210 or the open loop output phase correction circuit 212 is omitted.

Figure 8:
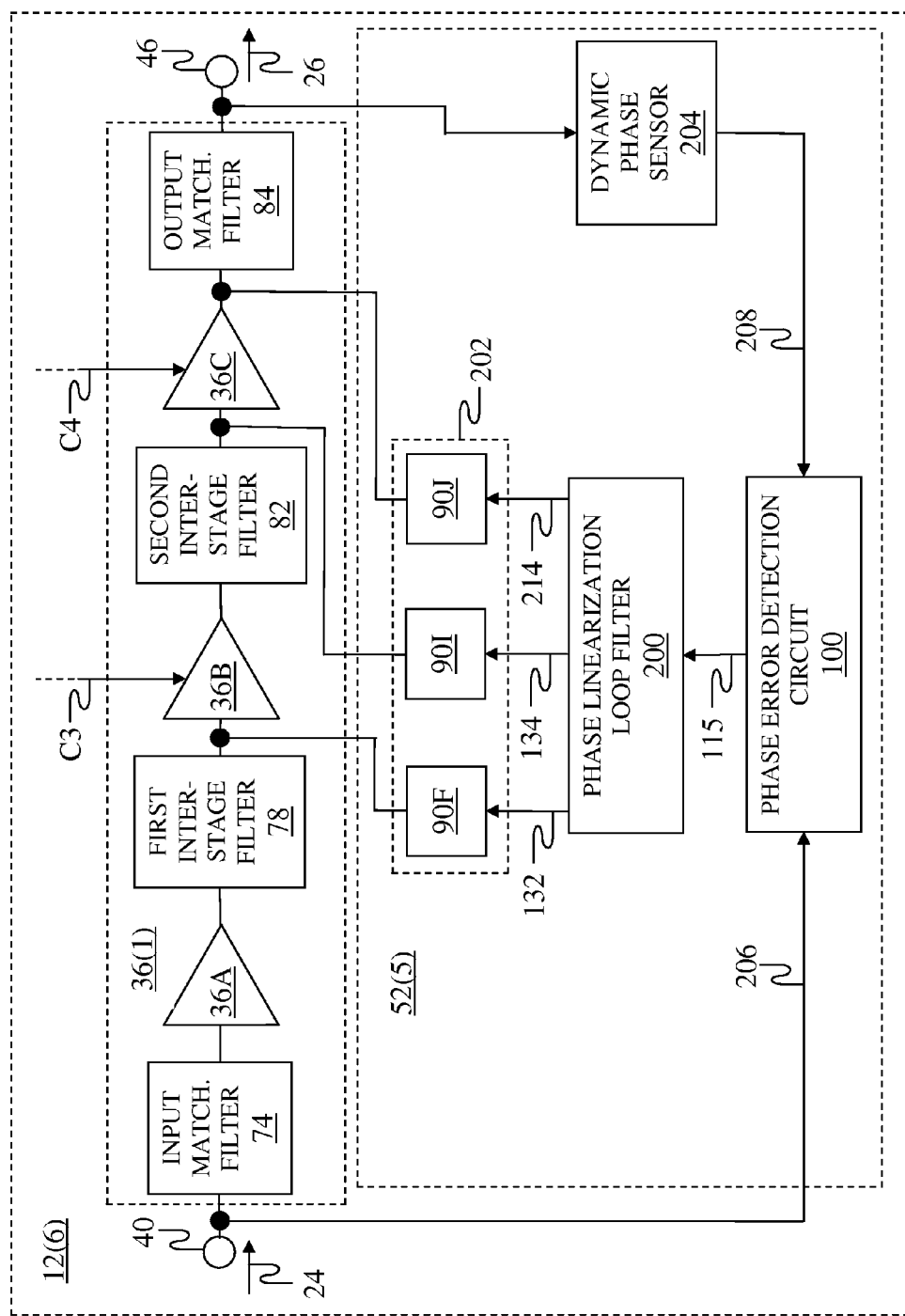
FIG. 8 illustrates details of a partial embodiment of the RF amplification device shown in FIG. 1 according to another embodiment of the RF amplification device.

FIG. 8 illustrates details of a partial embodiment of the RF amplification device 12 shown in FIG. 1 according to another embodiment of the RF amplification device 12. The embodiment of the RF amplification device 12(6) illustrated in FIG. 8 includes one embodiment of the RF amplification circuit 36(1) and one embodiment of the closed-loop phase linearization circuit 52(5). The RF amplification circuit 36(1) illustrated in FIG. 8 is similar to the RF amplification circuit 36(1) illustrated in FIG. 4. The closed-loop phase linearization circuit 52(5) illustrated in FIG. 8 shows details of the closed-loop phase linearization circuits 52, 52(1) illustrated in FIGS. 1 and 4, respectively.

The RF amplification device 12(6) illustrated in FIG. 8 is similar to the RF amplification device 12(4) illustrated in FIG. 6, except in the RF amplification device 12(6) illustrated in FIG. 8, the second harmonic filter 98 is omitted and the phase correction circuitry 202 further includes a post final stage phase control block 90J. Additionally, instead of being coupled to the output from the initial RF amplifier stage 36A, the phase error detection circuit 100 is directly coupled to the input terminus 40. As such, the RF signal 24 is the phase reference signal 206.

The dynamic phase sensor 204 is directly coupled between the output terminus 46 and the phase error detection circuit 100. As such, the output matching filter 84 may provide sufficient harmonic removal to allow elimination of the second harmonic filter 98 (FIG. 6). The post final stage phase control block 90J is coupled between the phase linearization loop filter 200 and an output from the final RF amplifier stage 36C. The phase linearization loop filter 200 provides a third phase control signal 214 to the post final stage phase control block 90J. The post final stage phase control block 90J applies a phase correction to the RF amplification circuit 36(1) based on the third phase control signal 214. As such, the phase correction circuitry 202 further reduces phase distortion in the RF amplification circuit 36(1) based on the phase error signal 115.

Figure 9:
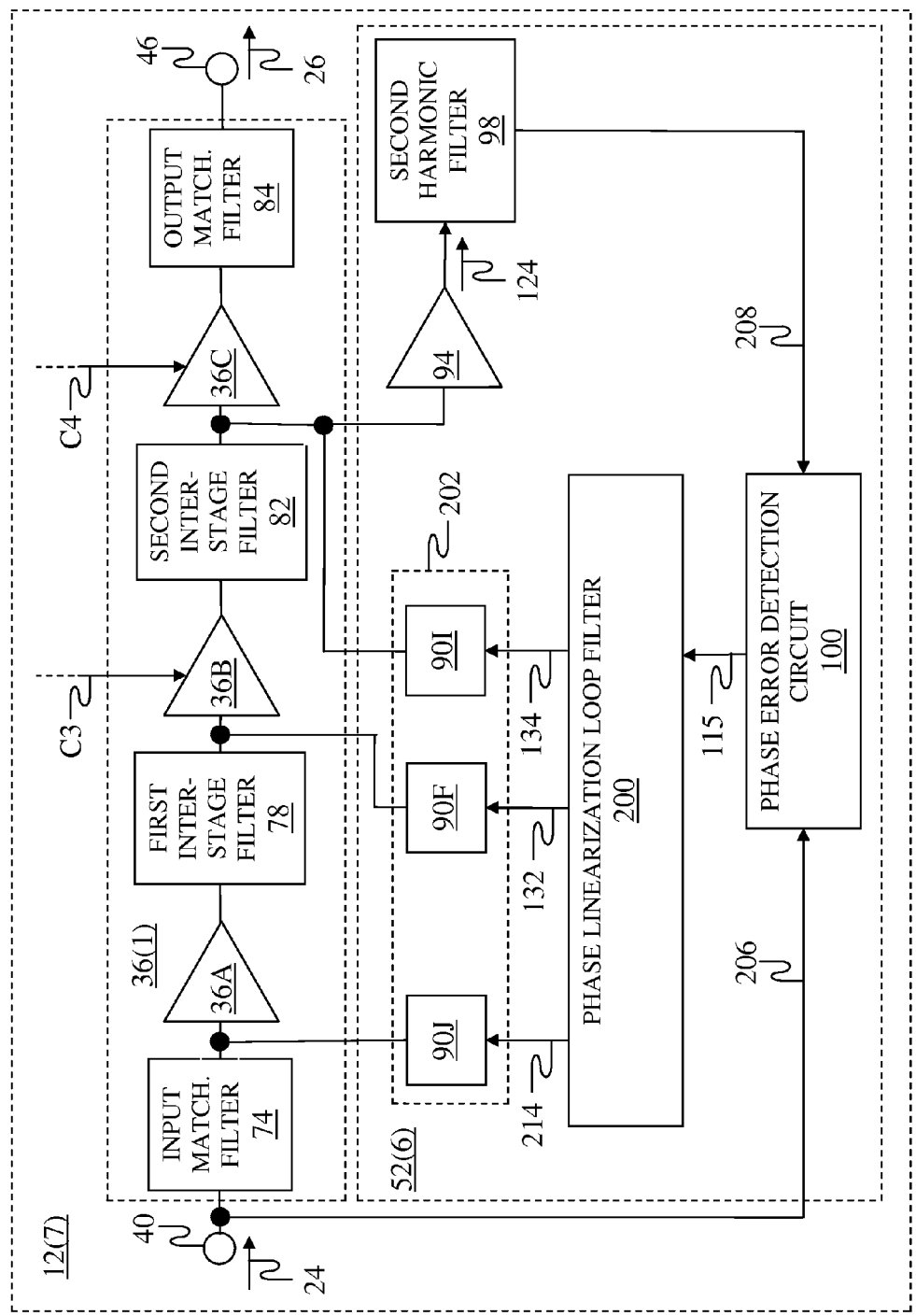
FIG. 9 illustrates details of a partial embodiment of the RF amplification device shown in FIG. 1 according to a further embodiment of the RF amplification device.

FIG. 9 illustrates details of a partial embodiment of the RF amplification device 12 shown in FIG. 1 according to a further embodiment of the RF amplification device 12. The embodiment of the RF amplification device 12(7) illustrated in FIG. 9 includes one embodiment of the RF amplification circuit 36(1) and one embodiment of the closed-loop phase linearization circuit 52(6). The RF amplification circuit 36(1) illustrated in FIG. 9 is similar to the RF amplification circuit 36(1) illustrated in FIG. 4. The closed-loop phase linearization circuit 52(6) illustrated in FIG. 9 shows details of the closed-loop phase linearization circuits 52, 52(1) illustrated in FIGS. 1 and 4, respectively.

The RF amplification device 12(7) illustrated in FIG. 9 is similar to the RF amplification device 12(6) illustrated in FIG. 8, except in the RF amplification device 12(7) illustrated in FIG. 9, the phase control blocks 90F, 90I, 90J are coupled to different nodes in the RF amplification circuit 36(1).

Figure 10:
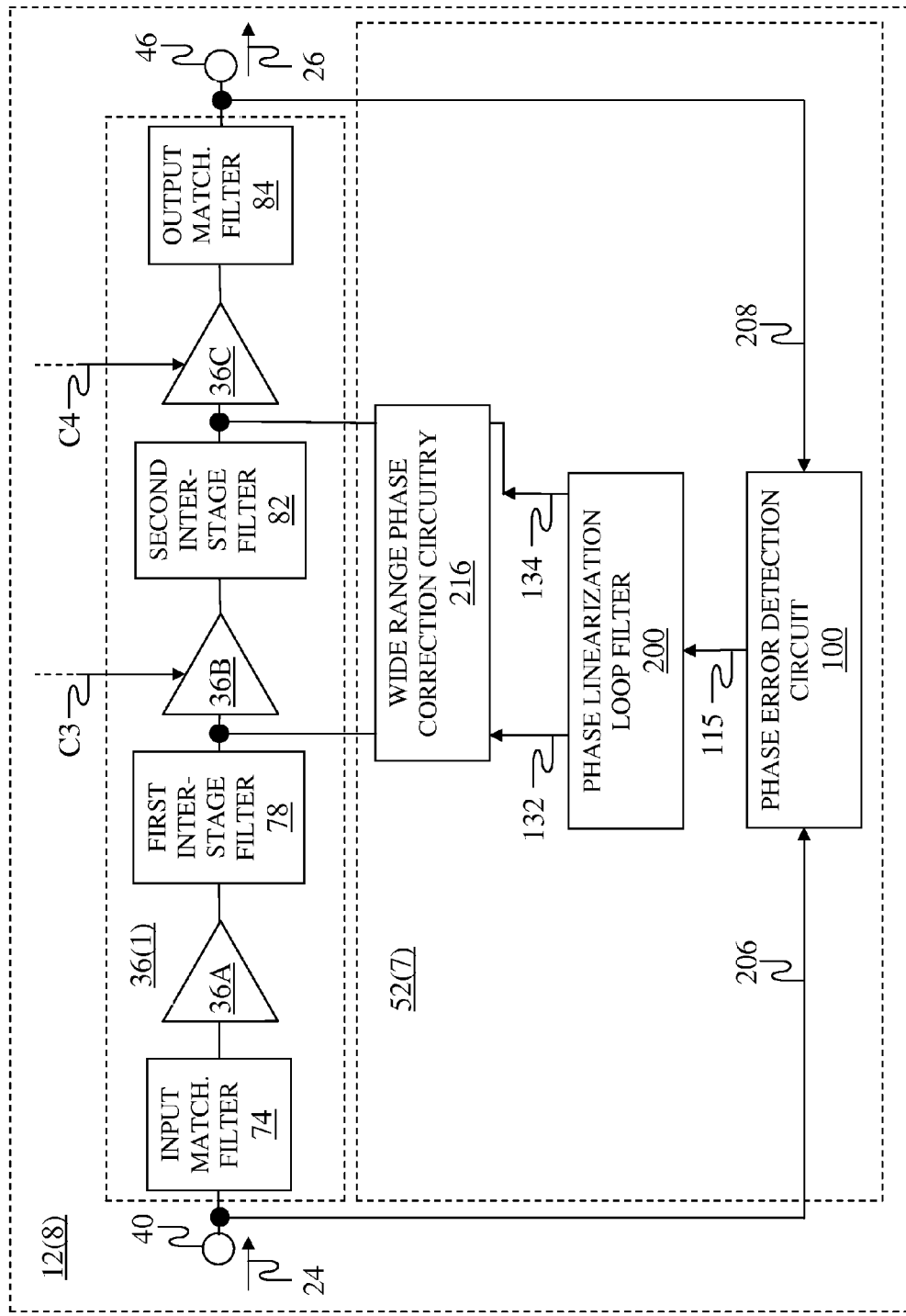
FIG. 10 illustrates details of a partial embodiment of the RF amplification device shown in FIG. 1 according to a supplemental embodiment of the RF amplification device.

FIG. 10 illustrates details of a partial embodiment of the RF amplification device 12 shown in FIG. 1 according to a supplemental embodiment of the RF amplification device 12. The embodiment of the RF amplification device 12(8) illustrated in FIG. 10 includes one embodiment of the RF amplification circuit 36(1) and one embodiment of the closed-loop phase linearization circuit 52(7). The RF amplification circuit 36(1) illustrated in FIG. 10 is similar to the RF amplification circuit 36(1) illustrated in FIG. 4. The closed-loop phase linearization circuit 52(7) illustrated in FIG. 10 shows details of the closed-loop phase linearization circuits 52, 52(1) illustrated in FIGS. 1 and 4, respectively.

The RF amplification device 12(8) illustrated in FIG. 10 is similar to the RF amplification device 12(6) illustrated in FIG. 8, except in the RF amplification device 12(8) illustrated in FIG. 10, the phase correction circuitry 202 is replaced with a wide range phase correction circuitry 216 and the dynamic phase sensor 204 is omitted. The dynamic phase sensor 204 (FIG. 8) provides the phase feedback signal 208 by detecting the phase distortion of the RF amplification circuit 36(1). However, the dynamic phase sensor 204 may be substantially unresponsive to the phase-drift of the RF amplification circuit 36(1).

The phase error detection circuit 100 receives the phase reference signal 206, which is based on the target phase. The phase error detection circuit 100 provides the phase error signal 115 based on a phase difference between the phase reference signal 206 and the phase feedback signal 208. The closed-loop phase linearization circuit 52(7) reduces both the phase distortion and the phase-drift in the RF amplification circuit 36(1) based on the phase error signal 115.

Figure 11:
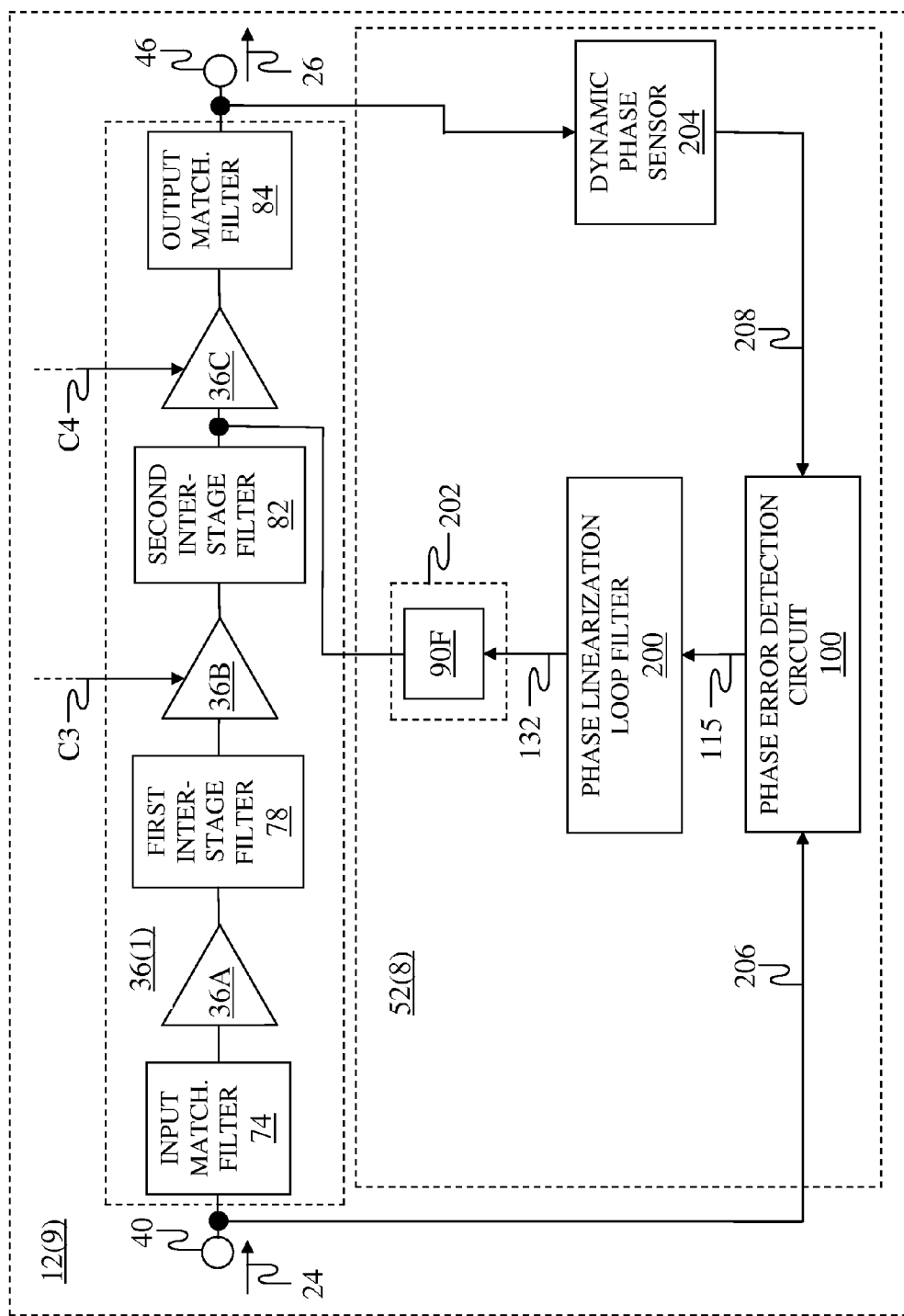
FIG. 11 illustrates details of a partial embodiment of the RF amplification device shown in FIG. 1 according to one embodiment of the RF amplification device.

FIG. 11 illustrates details of a partial embodiment of the RF amplification device 12 shown in FIG. 1 according to one embodiment of the RF amplification device 12. The embodiment of the RF amplification device 12(9) illustrated in FIG. 11 includes one embodiment of the RF amplification circuit 36(1) and one embodiment of the closed-loop phase linearization circuit 52(8). The RF amplification circuit 36(1) illustrated in FIG. 11 is similar to the RF amplification circuit 36(1) illustrated in FIG. 4. The closed-loop phase linearization circuit 52(8) illustrated in FIG. 11 shows details of the closed-loop phase linearization circuits 52, 52(1) illustrated in FIGS. 1 and 4, respectively.

The RF amplification device 12(9) illustrated in FIG. 11 is similar to the RF amplification device 12(6) illustrated in FIG. 8, except in the RF amplification device 12(9) illustrated in FIG. 11, the final stage phase control block 90I and the post final stage phase control block 90J are omitted. In this regard, the phase correction circuitry 202 has a single phase control block 90F. The RF amplification circuit 36(1) has a group of RF amplifier stages 36A, 36B, 36C coupled in series. The single phase control block 90F is coupled to one of the group of RF amplifier stages 36A, 36B, 36C. As such, the single phase control block 90F reduces the phase distortion in the RF amplification circuit 36(1) based on the phase error signal 115.

Figure 12:
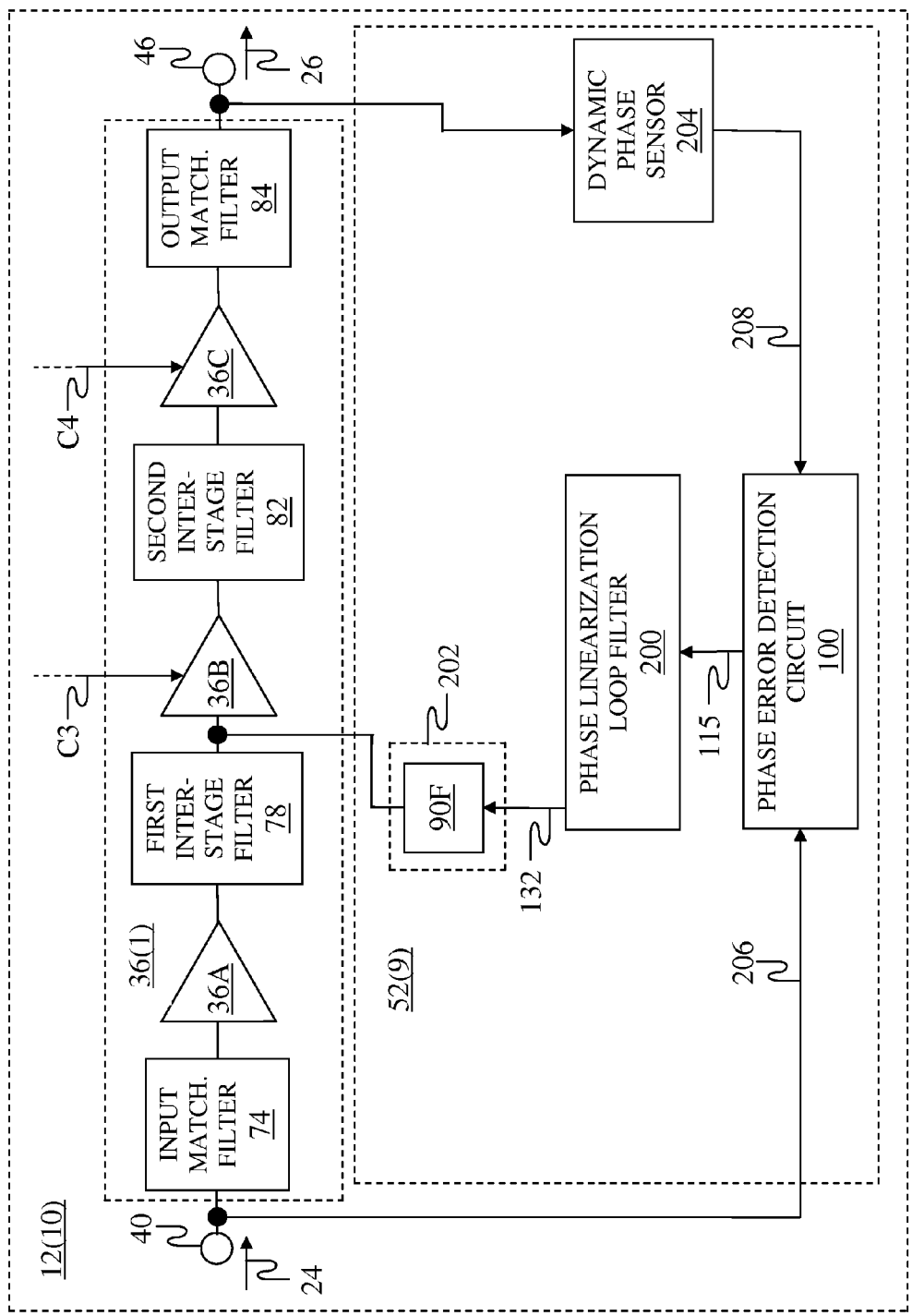
FIG. 12 illustrates details of a partial embodiment of the RF amplification device shown in FIG. 1 according to an alternate embodiment of the RF amplification device.

FIG. 12 illustrates details of a partial embodiment of the RF amplification device 12 shown in FIG. 1 according to an alternate embodiment of the RF amplification device 12. The embodiment of the RF amplification device 12(10) illustrated in FIG. 12 includes one embodiment of the RF amplification circuit 36(1) and one embodiment of the closed-loop phase linearization circuit 52(9). The RF amplification circuit 36(1) illustrated in FIG. 12 is similar to the RF amplification circuit 36(1) illustrated in FIG. 4. The closed-loop phase linearization circuit 52(9) illustrated in FIG. 12 shows details of the closed-loop phase linearization circuits 52, 52(1) illustrated in FIGS. 1 and 4, respectively.

The RF amplification device 12(10) illustrated in FIG. 12 is similar to the RF amplification device 12(9) illustrated in FIG. 11, except in the RF amplification device 12(10) illustrated in FIG. 12, the single phase control block 90F is coupled to another of the group of RF amplifier stages 36A, 36B, 36C. As such, the single phase control block 90F reduces the phase distortion in the RF amplification circuit 36(1) based on the phase error signal 115.

Figure 13:
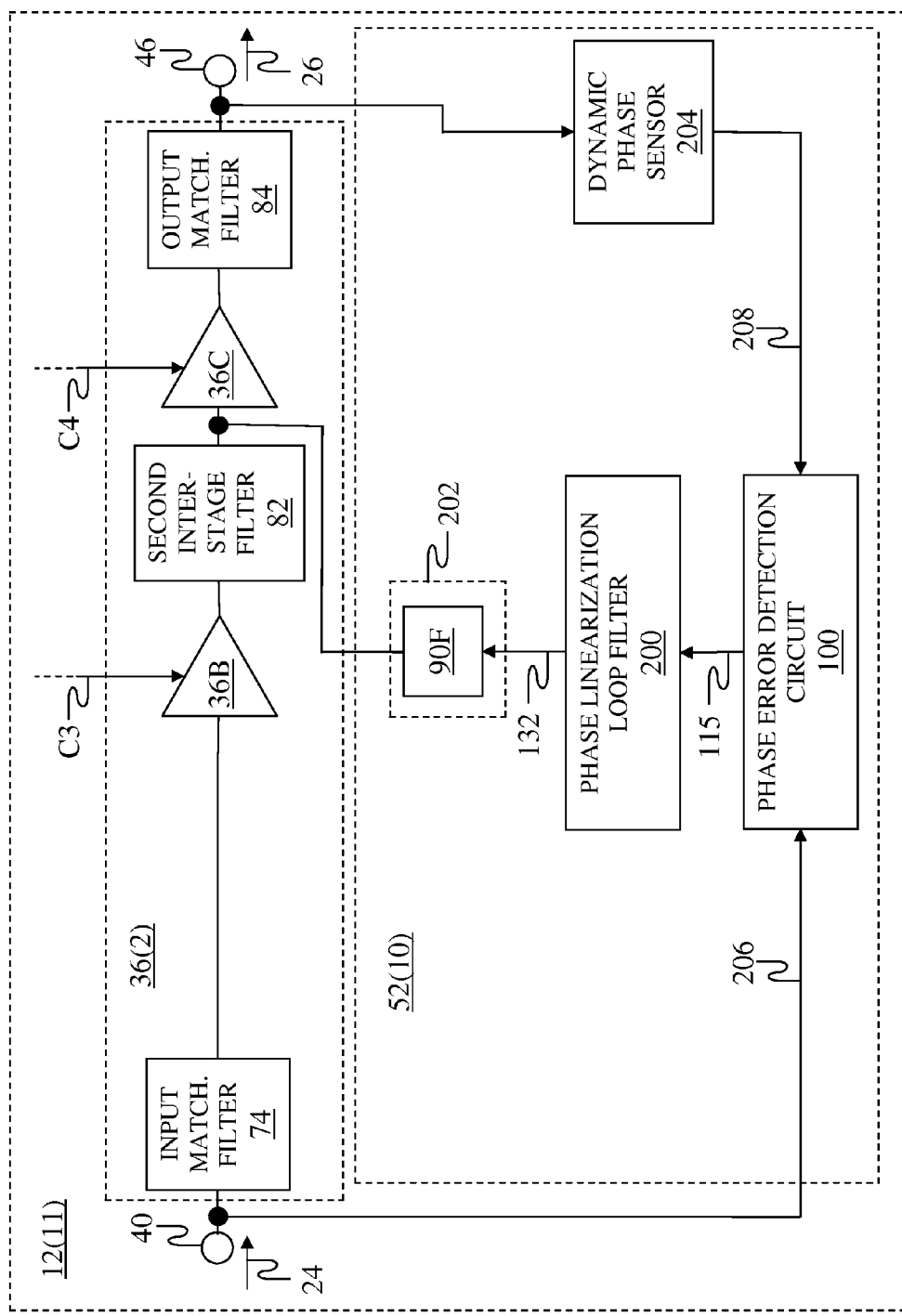
FIG. 13 illustrates details of a partial embodiment of the RF amplification device shown in FIG. 1 according to an additional embodiment of the RF amplification device.

FIG. 13 illustrates details of a partial embodiment of the RF amplification device 12 shown in FIG. 1 according to an additional embodiment of the RF amplification device 12. The embodiment of the RF amplification device 12(11) illustrated in FIG. 13 includes one embodiment of the RF amplification circuit 36(2) and one embodiment of the closed-loop phase linearization circuit 52(10). The RF amplification circuit 36(2) illustrated in FIG. 13 is similar to the RF amplification circuit 36(1) illustrated in FIG. 4, except in the RF amplification circuit 36(2) illustrated in FIG. 13, the initial RF amplifier stage 36A and the first interstage filter 78 are omitted. As such, the input matching filter 74 is coupled between the input terminus 40 and the input to the intermediate RF amplifier stage 36B. The closed-loop phase linearization circuit 52(10) illustrated in FIG. 13 shows details of the closed-loop phase linearization circuits 52, 52(1) illustrated in FIGS. 1 and 4, respectively.

The RF amplification device 12(11) illustrated in FIG. 13 is similar to the RF amplification device 12(9) illustrated in FIG. 11, except in the RF amplification device 12(11) illustrated in FIG. 13, the initial RF amplifier stage 36A and the first interstage filter 78 are omitted. As such, the group of RF amplifier stages 36B, 36C includes the intermediate RF amplifier stage 36B and the final RF amplifier stage 36C.

Figure 14:
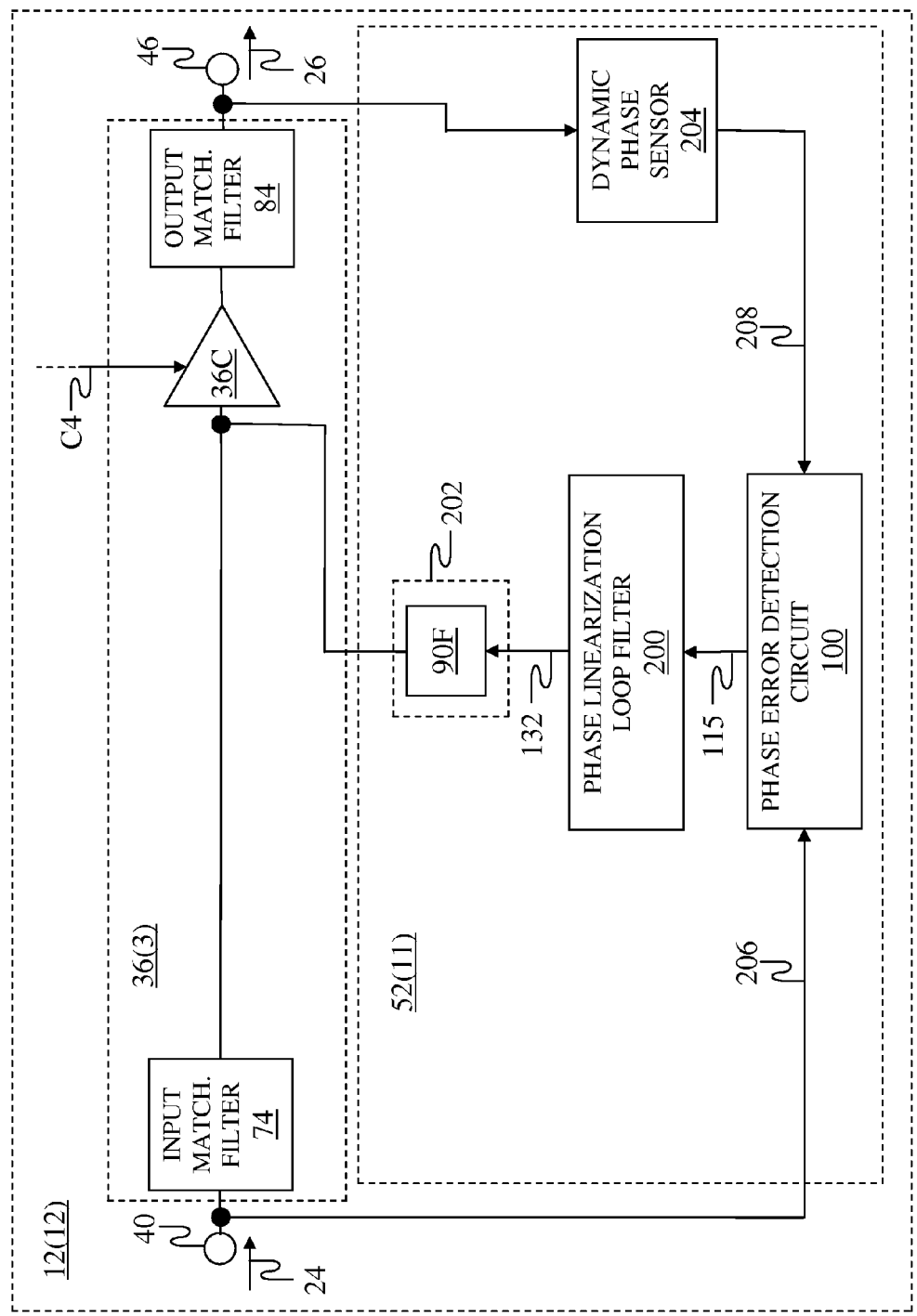
FIG. 14 illustrates details of a partial embodiment of the RF amplification device shown in FIG. 1 according to another embodiment of the RF amplification device.

FIG. 14 illustrates details of a partial embodiment of the RF amplification device 12 shown in FIG. 1 according to another embodiment of the RF amplification device 12. The embodiment of the RF amplification device 12(12) illustrated in FIG. 14 includes one embodiment of the RF amplification circuit 36(3) and one embodiment of the closed-loop phase linearization circuit 52(11). The RF amplification circuit 36(3) illustrated in FIG. 14 is similar to the RF amplification circuit 36(1) illustrated in FIG. 4, except in the RF amplification circuit 36(3) illustrated in FIG. 14, the initial RF amplifier stage 36A, the first interstage filter 78, the intermediate RF amplifier stage 36B, and the second interstage filter 82 are omitted. As such, the input matching filter 74 is coupled between the input terminus 40 and the input to the final RF amplifier stage 36C. The closed-loop phase linearization circuit 52(11) illustrated in FIG. 14 shows details of the closed-loop phase linearization circuits 52, 52(1) illustrated in FIGS. 1 and 4, respectively.

The RF amplification device 12(12) illustrated in FIG. 14 is similar to the RF amplification device 12(11) illustrated in FIG. 13, except in the RF amplification device 12(12) illustrated in FIG. 14, the intermediate RF amplifier stage 36B and the second interstage filter 82 are omitted. As such, the RF amplification circuit 36(3) has a single RF amplifier stage, namely the final RF amplifier stage 36C.

Figure 15:
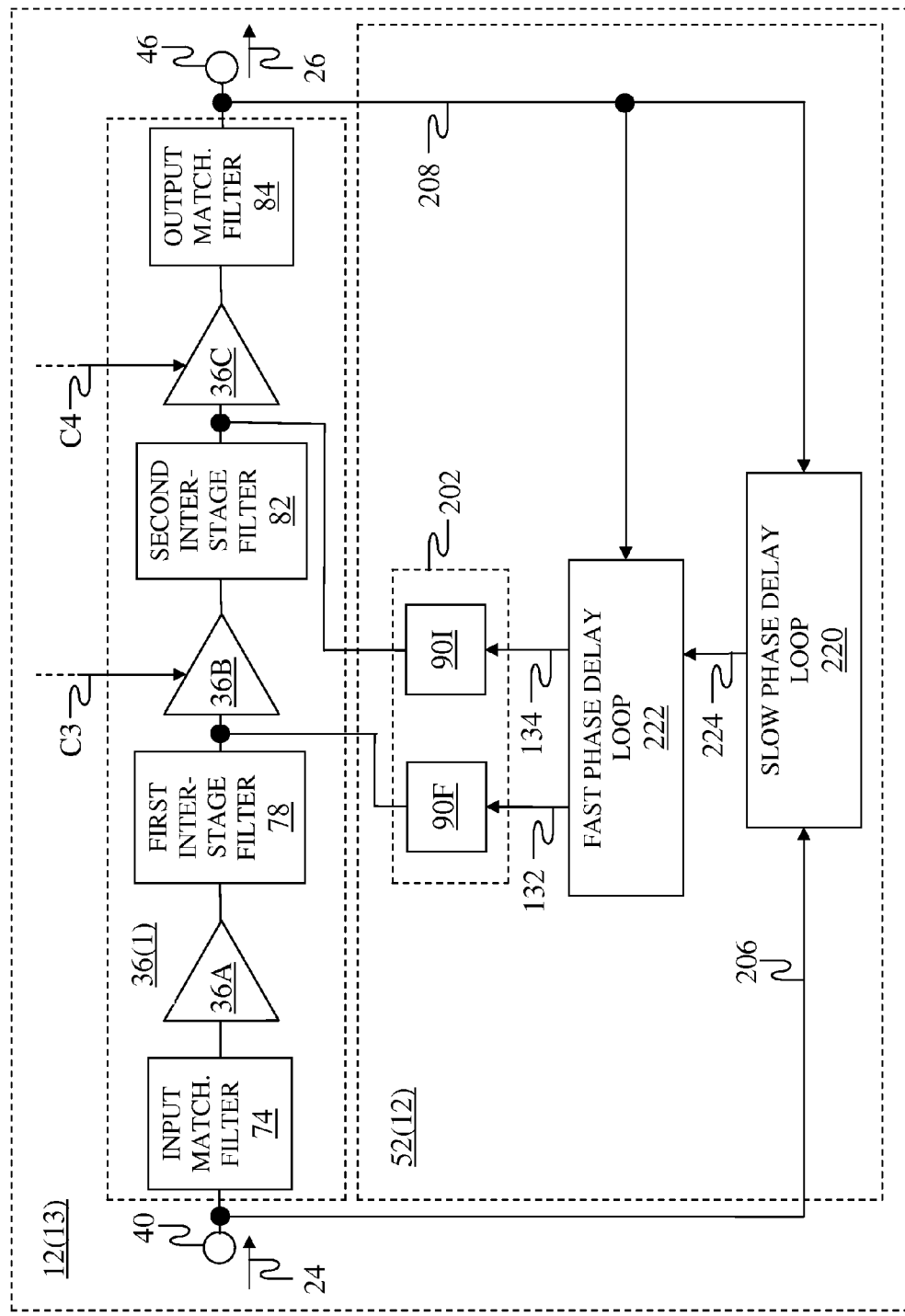
FIG. 15 illustrates details of a partial embodiment of the RF amplification device shown in FIG. 1 according to a further embodiment of the RF amplification device.

FIG. 15 illustrates details of a partial embodiment of the RF amplification device 12 shown in FIG. 1 according to a further embodiment of the RF amplification device 12. The embodiment of the RF amplification device 12(13) illustrated in FIG. 15 includes one embodiment of the RF amplification circuit 36(1) and one embodiment of the closed-loop phase linearization circuit 52(12). The RF amplification circuit 36(1) illustrated in FIG. 15 is similar to the RF amplification circuit 36(1) illustrated in FIG. 4. The closed-loop phase linearization circuit 52(12) illustrated in FIG. 15 shows details of the closed-loop phase linearization circuits 52, 52(1) illustrated in FIGS. 1 and 4, respectively.

The RF amplification device 12(13) illustrated in FIG. 15 is similar to the RF amplification device 12(6) illustrated in FIG. 8, except in the RF amplification device 12(13) illustrated in FIG. 15, the post final stage phase control block 90J is omitted and the phase error detection circuit 100, the phase linearization loop filter 200, and the dynamic phase sensor 204 are replaced with a slow phase delay loop 220 and a fast phase delay loop 222.

The slow phase delay loop 220 receives the phase reference signal 206, which is based on the target phase. The slow phase delay loop 220 further receives the phase feedback signal 208, which is based on the measured phase. The slow phase delay loop 220 provides a dynamic phase reference signal 224 based on a phase difference between the phase reference signal 206 and the phase feedback signal 208. The fast phase delay loop 222 receives the phase feedback signal 208 and the dynamic phase reference signal 224. The fast phase delay loop 222 provides the first phase control signal 132 and the second phase control signal 134 based on a phase difference between the dynamic phase reference signal 224 and the phase feedback signal 208.

In general, the fast phase delay loop 222 provides at least one phase control signal 132, 134 based on the phase difference between the dynamic phase reference signal 224 and the phase feedback signal 208. The slow phase delay loop 220 is responsive to the static phase response of the RF amplification circuit 36(1) and is responsive to the phase-drift of the RF amplification circuit 36(1). However, the slow phase delay loop 220 is substantially unresponsive to the phase distortion in the RF amplification circuit 36(1). Therefore, the dynamic phase reference signal 224 is representative of both the static phase response of the RF amplification circuit 36(1) and the phase-drift of the RF amplification circuit 36(1). The phase feedback signal 208 is representative of the static phase response of the RF amplification circuit 36(1), the phase-drift of the RF amplification circuit 36(1), and the phase distortion in the RF amplification circuit 36(1).

Since the at least one phase control signal 132, 134 is based on the phase difference between the dynamic phase reference signal 224 and the phase feedback signal 208, both the static phase response of the RF amplification circuit 36(1) and the phase-drift of the RF amplification circuit 36(1) are subtracted out by the fast phase delay loop 222, thereby leaving only the representation of the phase distortion in the RF amplification circuit 36(1). In this regard, the fast phase delay loop 222 is substantially unresponsive to both the static phase response of the RF amplification circuit 36(1) and the phase-drift of the RF amplification circuit 36(1). Therefore, the closed-loop phase linearization circuit 52(12) reduces the phase distortion based on the at least one phase control signal 132, 134.

Figure 16:
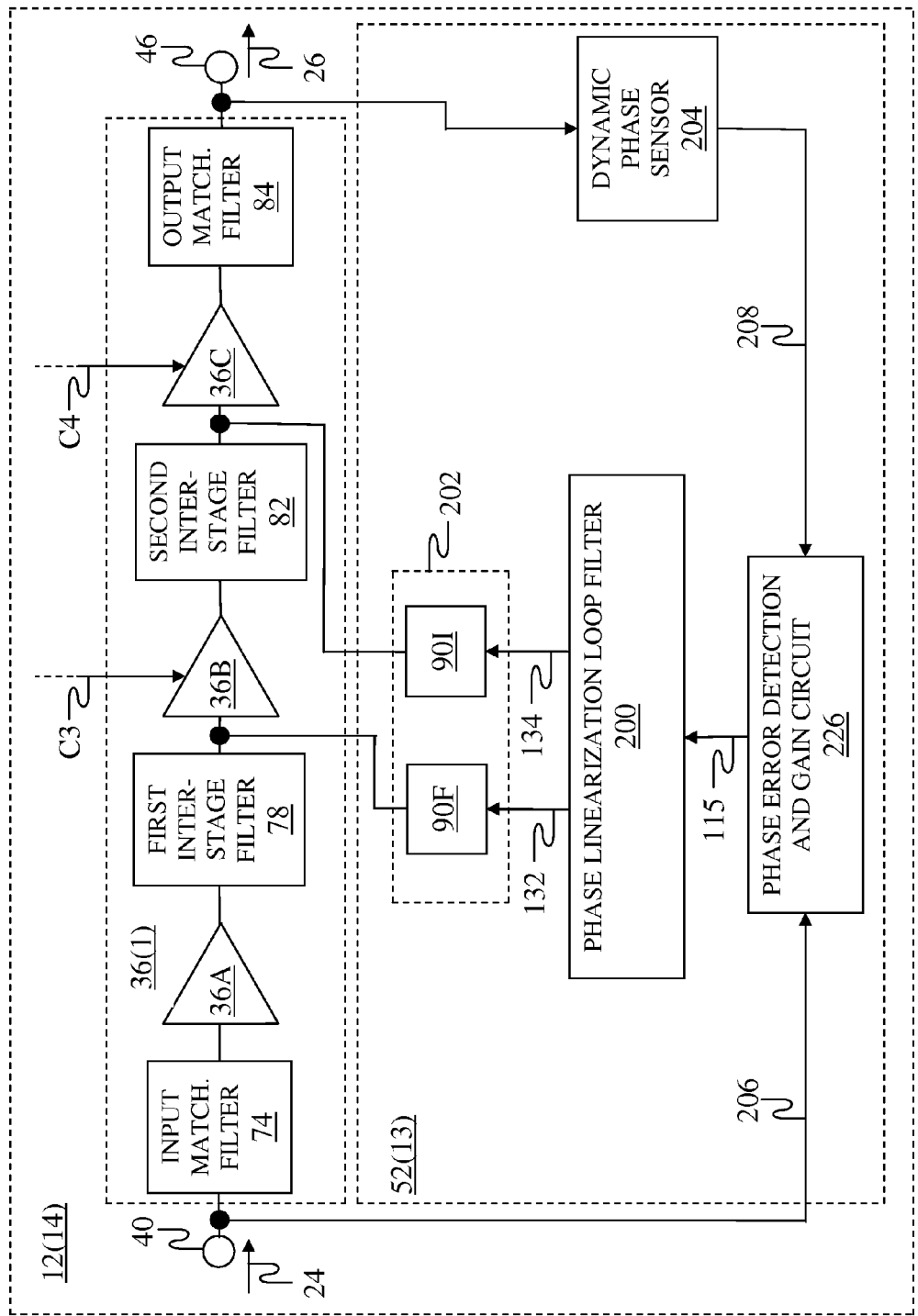
FIG. 16 illustrates details of a partial embodiment of the RF amplification device shown in FIG. 1 according to a supplemental embodiment of the RF amplification device.

FIG. 16 illustrates details of a partial embodiment of the RF amplification device 12 shown in FIG. 1 according to a supplemental embodiment of the RF amplification device 12. The embodiment of the RF amplification device 12(14) illustrated in FIG. 16 includes one embodiment of the RF amplification circuit 36(1) and one embodiment of the closed-loop phase linearization circuit 52(13). The RF amplification circuit 36(1) illustrated in FIG. 16 is similar to the RF amplification circuit 36(1) illustrated in FIG. 4. The closed-loop phase linearization circuit 52(13) illustrated in FIG. 16 shows details of the closed-loop phase linearization circuits 52, 52(1) illustrated in FIGS. 1 and 4, respectively.

The RF amplification device 12(14) illustrated in FIG. 16 is similar to the RF amplification device 12(6) illustrated in FIG. 8, except in the RF amplification device 12(14) illustrated in FIG. 16, the post final stage phase control block 90J is omitted and the phase error detection circuit 100 is replaced with a phase error detection and gain circuit 226. In this regard, the phase error detection and gain circuit 226 receives the phase reference signal 206, which is based on the target phase and the RF signal 24. The phase error detection and gain circuit 226 receives the phase feedback signal 208, which is based on the measured phase. The phase error detection and gain circuit 226 provides the phase error signal 115 based on a phase difference between the phase reference signal 206 and the phase feedback signal 208.

At low operating power levels of the RF amplification circuit 36(1), an amplitude of the RF signal 24 is relatively low. As such, a magnitude of the phase error signal 115 may weaken, thereby reducing the phase correction provided by the closed-loop phase linearization circuit 52(13). To compensate for this effect, the phase error detection and gain circuit 226 adjusts a magnitude of the phase error signal 115 based on the amplitude of the phase reference signal 206. In one embodiment of the phase error detection and gain circuit 226, the phase error detection and gain circuit 226 increases a gain of the phase error detection and gain circuit 226 as the amplitude of the phase reference signal 206 decreases, and vice versa. These gain adjustments at least partially regulate the magnitude of the phase error signal 115, thereby extending a dynamic range of the closed-loop phase linearization circuit 52(13). In this regard, the closed-loop phase linearization circuit 52(13) further reduces the phase distortion in the RF amplification circuit 36(1) based on magnitude variations of the phase error signal 115.

Figure 17A:
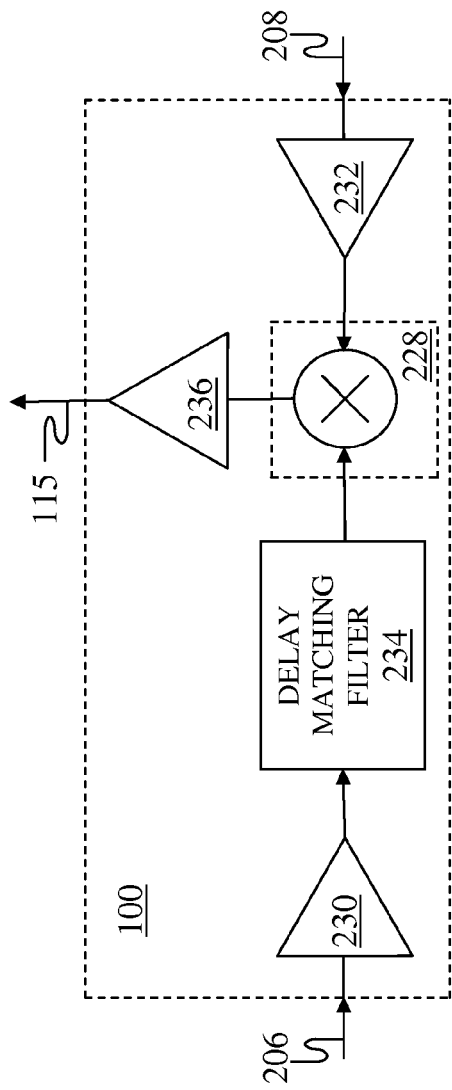
FIG. 17A shows details of a phase error detection circuit illustrated in FIG. 5 according to one embodiment of the phase error detection circuit.

FIG. 17A shows details of the phase error detection circuit 100 illustrated in FIG. 5 according to one embodiment of the phase error detection circuit 100. The phase error detection circuit 100 includes an RF mixer 228, a phase reference buffer 230, a phase feedback buffer 232, a delay matching filter 234, and a phase error buffer 236. The phase reference buffer 230 receives and buffers the phase reference signal 206 to provide a buffered phase reference signal to the delay matching filter 234. The delay matching filter 234 filters the buffered phase reference signal to provide a filtered phase reference signal to the RF mixer 228. In one embodiment of the phase error detection circuit 100, the filtered phase reference signal provides a substantially clean phase reference to the RF mixer 228. The phase feedback buffer 232 receives and buffers the phase feedback signal 208 to provide a buffered phase feedback signal to the RF mixer 228.

The RF mixer 228 mixes the filtered phase reference signal and the buffered phase feedback signal to provide an unbuffered phase error signal to the phase error buffer 236. The phase error buffer 236 receives and buffers the un-buffered phase error signal to provide the phase error signal 115. In this regard, the phase error signal 115 is representative of a phase difference between the phase reference signal 206 and the phase feedback signal 208. In one embodiment of the phase error detection circuit 100, the filtered phase reference signal functions as a local oscillator signal. As such, in general, the phase reference signal 206 functions as a local oscillator signal. In an alternate embodiment of the phase error detection circuit 100, any or all of the phase reference buffer 230, the phase feedback buffer 232, the delay matching filter 234, and the phase error buffer 236 are omitted.

Figure 17B:
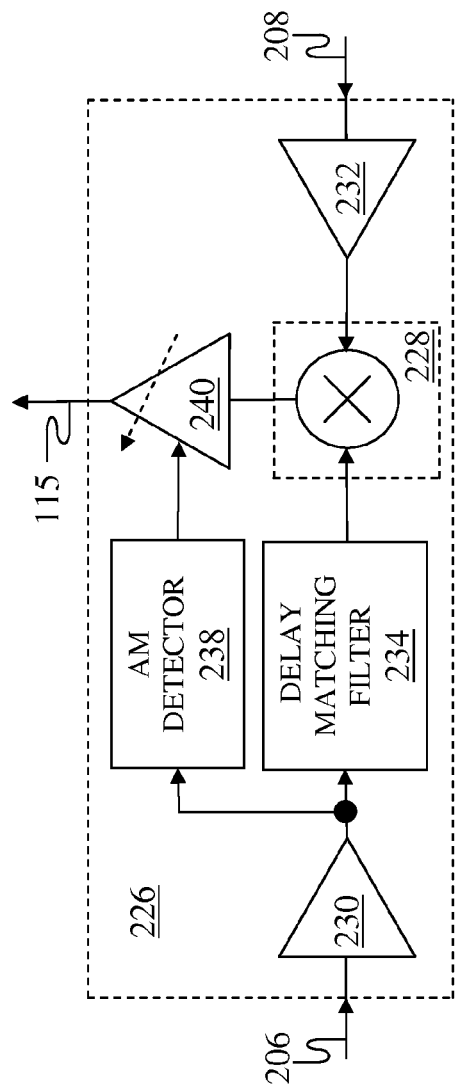
FIG. 17B shows details of a phase error detection and gain circuit illustrated in FIG. 16 according to one embodiment of the phase error detection and gain circuit.

FIG. 17B shows details of the phase error detection and gain circuit 226 illustrated in FIG. 16 according to one embodiment of the phase error detection and gain circuit 226. The phase error detection and gain circuit 226 includes the RF mixer 228, the phase reference buffer 230, the phase feedback buffer 232, the delay matching filter 234, an AM detector 238, and a variable-gain phase error amplifier 240. The phase reference buffer 230 receives and buffers the phase reference signal 206 to provide the buffered phase reference signal to the delay matching filter 234 and to the AM detector 238. The delay matching filter 234 filters the buffered phase reference signal to provide the filtered phase reference signal to the RF mixer 228. In one embodiment of the phase error detection and gain circuit 226, the filtered phase reference signal provides a substantially clean phase reference to the RF mixer 228. The phase feedback buffer 232 receives and buffers the phase feedback signal 208 to provide the buffered phase feedback signal to the RF mixer 228.

The RF mixer 228 mixes the filtered phase reference signal and the buffered phase feedback signal to provide the un-buffered phase error signal to the variable-gain phase error amplifier 240. The variable-gain phase error amplifier 240 receives and amplifies the un-buffered phase error signal to provide the phase error signal 115. In this regard, the phase error signal 115 is representative of a phase difference between the phase reference signal 206 and the phase feedback signal 208. In one embodiment of the phase error detection and gain circuit 226, the filtered phase reference signal functions as a local oscillator signal. As such, in general, the phase reference signal 206 functions as a local oscillator signal.

The AM detector 238 detects an envelope of the phase reference signal 206 using the buffered phase reference signal to provide an envelope signal to the variable-gain phase error amplifier 240. In this regard, the envelope signal is representative of the amplitude of the phase reference signal 206. A gain of the variable-gain phase error amplifier 240 is based on the envelope signal. Therefore, a magnitude of the phase error signal 115 is based on the amplitude of the phase reference signal 206, such that as the amplitude of the phase reference signal 206 decreases, the gain of the variable-gain phase error amplifier 240 increases, and vice versa. In an alternate embodiment of the phase error detection and gain circuit 226, any or all of the phase reference buffer 230, the phase feedback buffer 232, and the delay matching filter 234 are omitted.

Figure 18:
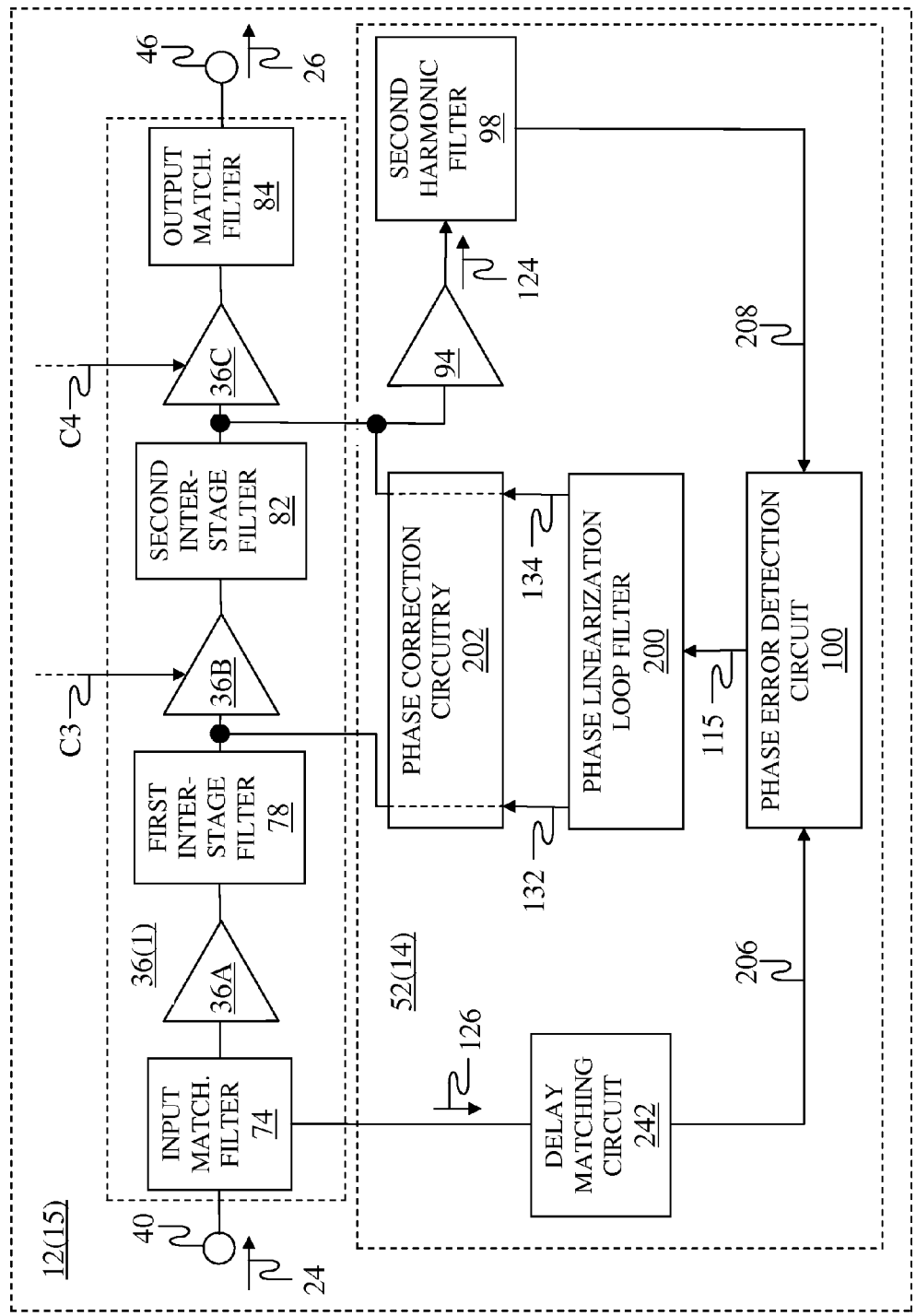
FIG. 18 illustrates details of a partial embodiment of the RF amplification device shown in FIG. 1 according to one embodiment of the RF amplification device.

FIG. 18 illustrates details of a partial embodiment of the RF amplification device 12 shown in FIG. 1 according to one embodiment of the RF amplification device 12. The embodiment of the RF amplification device 12(15) illustrated in FIG. 18 includes one embodiment of the RF amplification circuit 36(1) and one embodiment of the closed-loop phase linearization circuit 52(14). The RF amplification circuit 36(1) illustrated in FIG. 18 is similar to the RF amplification circuit 36(1) illustrated in FIG. 4. The closed-loop phase linearization circuit 52(14) illustrated in FIG. 18 shows details of the closed-loop phase linearization circuits 52, 52(1) illustrated in FIGS. 1 and 4, respectively.

The RF amplification device 12(15) illustrated in FIG. 18 is similar to the RF amplification device 12(3) illustrated in FIG. 5, except in the RF amplification device 12(15) illustrated in FIG. 18, the closed-loop phase linearization circuit 52(14) further includes a delay matching circuit 242 coupled between the input matching filter 74 and the phase error detection circuit 100. In general, the second harmonic filter 98 is coupled between the RF amplification circuit 36(1) and the phase error detection circuit 100. As such, the phase feedback signal 208 is based on the second harmonic filter 98. The delay matching circuit 242 is coupled between the RF amplification circuit 36(1) and the phase error detection circuit 100. The delay matching circuit 242 receives and delays the second reference signal 126 to provide the phase reference signal 206 to the phase error detection circuit 100.

In one embodiment of the second harmonic filter 98, as illustrated in FIG. 5, a delay of the second harmonic filter 98 is long enough to cause a timing mismatch between phase reference signal 206 and the phase feedback signal 208. To minimize effects of this timing mismatch, the delay of the delay matching circuit 242 is approximately equal to the delay of the second harmonic filter 98. In this regard, the timing of the phase feedback signal 208 relative to the timing of the phase reference signal 206 is appropriately aligned by the delay of the delay matching circuit 242, as illustrated in FIG. 18.

Figure 19:
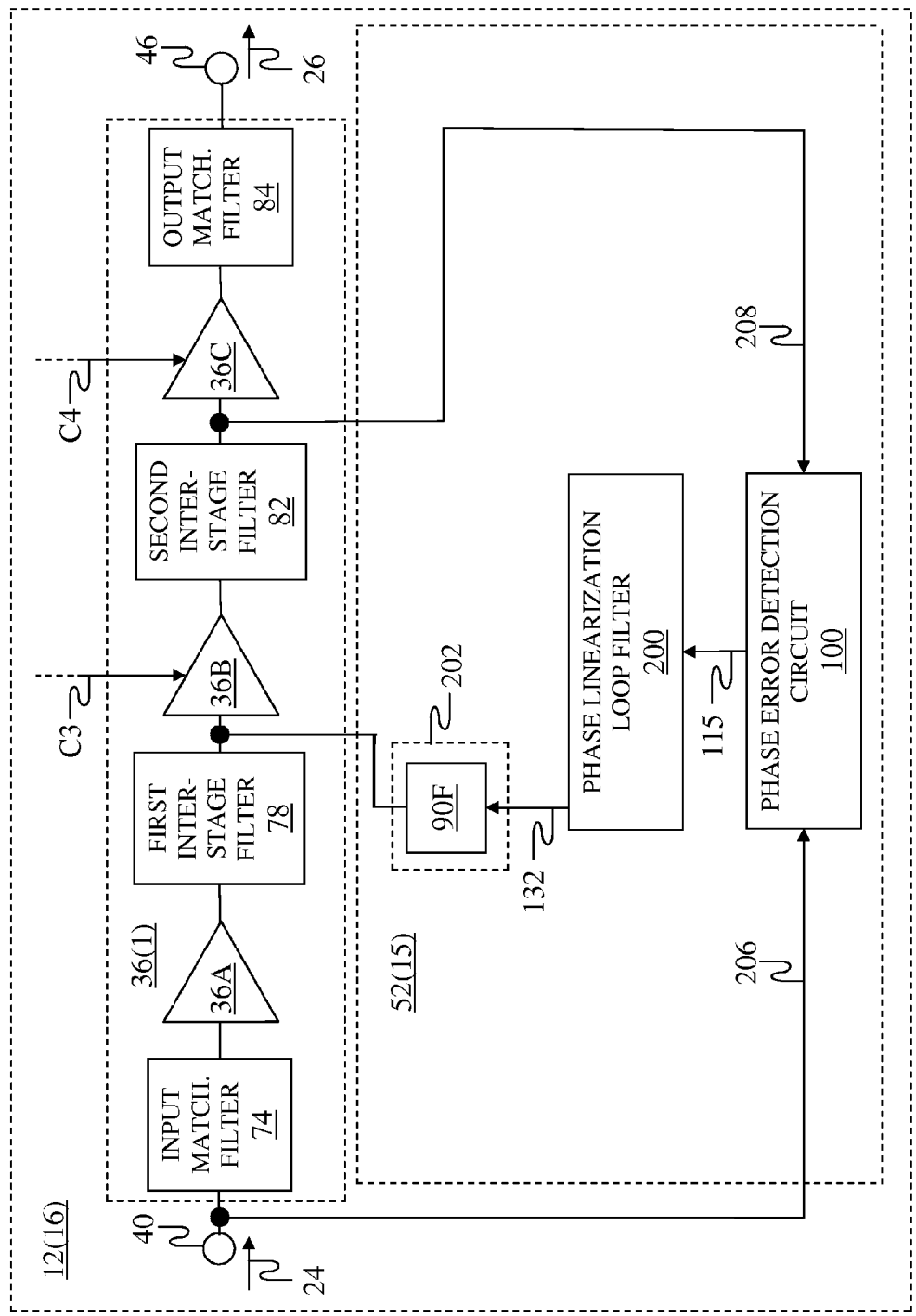
FIG. 19 illustrates details of a partial embodiment of the RF amplification device shown in FIG. 1 according to an alternate embodiment of the RF amplification device.

FIG. 19 illustrates details of a partial embodiment of the RF amplification device 12 shown in FIG. 1 according to an alternate embodiment of the RF amplification device 12. The embodiment of the RF amplification device 12(16) illustrated in FIG. 19 includes one embodiment of the RF amplification circuit 36(1) and one embodiment of the closed-loop phase linearization circuit 52(15). The RF amplification circuit 36(1) illustrated in FIG. 19 is similar to the RF amplification circuit 36(1) illustrated in FIG. 4. The closed-loop phase linearization circuit 52(15) illustrated in FIG. 19 shows details of the closed-loop phase linearization circuits 52, 52(1) illustrated in FIGS. 1 and 4, respectively.

The RF amplification device 12(16) illustrated in FIG. 19 is similar to the RF amplification device 12(10) illustrated in FIG. 12, except in the RF amplification device 12(16) illustrated in FIG. 19, the dynamic phase sensor 204 is omitted.

However, the closed-loop phase linearization circuit 52(15) is not responsive to phase distortion in the RF amplification circuit 36(1) between the output of the final RF amplifier stage 36C and the output terminus 46.

Figure 20:
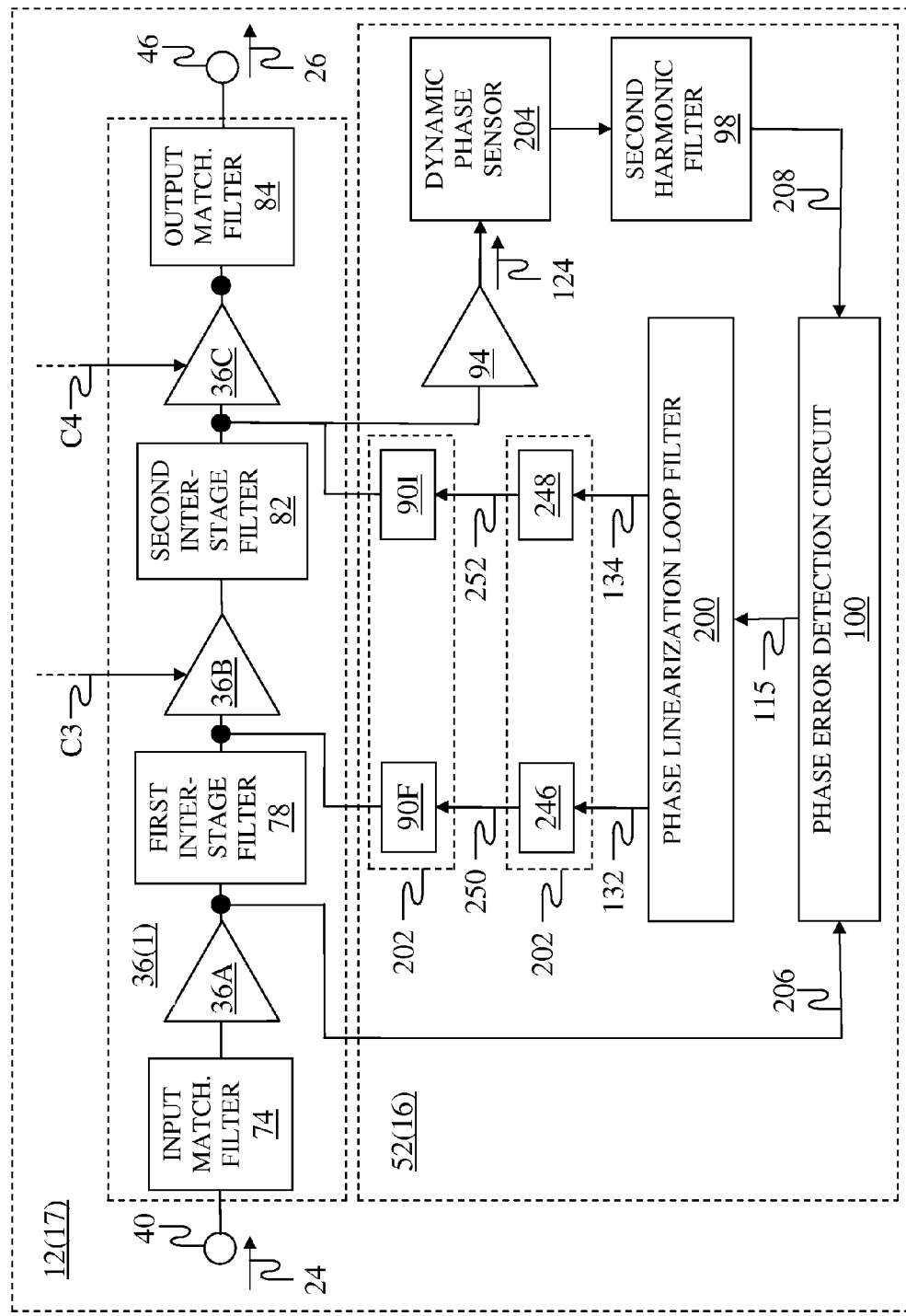
FIG. 20 illustrates details of a partial embodiment of the RF amplification device shown in FIG. 1 according to an additional embodiment of the RF amplification device.

FIG. 20 illustrates details of a partial embodiment of the RF amplification device 12 shown in FIG. 1 according to an additional embodiment of the RF amplification device 12. The embodiment of the RF amplification device 12(17) illustrated in FIG. 20 includes one embodiment of the RF amplification circuit 36(1) and one embodiment of the closed-loop phase linearization circuit 52(16). The RF amplification circuit 36(1) illustrated in FIG. 20 is similar to the RF amplification circuit 36(1) illustrated in FIG. 4. The closed-loop phase linearization circuit 52(16) illustrated in FIG. 20 shows details of the closed-loop phase linearization circuits 52, 52(1) illustrated in FIGS. 1 and 4, respectively.

The RF amplification device 12(17) illustrated in FIG. 20 is similar to the RF amplification device 12(4) illustrated in FIG. 6, except in the RF amplification device 12(17) illustrated in FIG. 20, a phase linearization noise filter 244 is coupled between the phase linearization loop filter 200 and the phase correction circuitry 202. The phase linearization noise filter 244 may reduce noise in the phase correction circuitry 202, thereby reducing noise in the RF amplification circuit 36(1).

Specifically, the phase linearization noise filter 244 includes a driver stage phase filter block 246 and a final stage phase filter block 248. The driver stage phase filter block 246 receives and filters the first phase control signal 132 to provide a first filtered phase control signal 250 to the driver stage phase control block 90F. Similarly, the final stage phase filter block 248 receives and filters the second phase control signal 134 to provide a second filtered phase control signal 252 to the final stage phase control block 90I. The driver stage phase control block 90F applies a phase correction to the RF amplification circuit 36(1) based on the first filtered phase control signal 250. Similarly, the final stage phase control block 90I applies a phase correction to the RF amplification circuit 36(1) based on the second filtered phase control signal 252.

Figure 21:
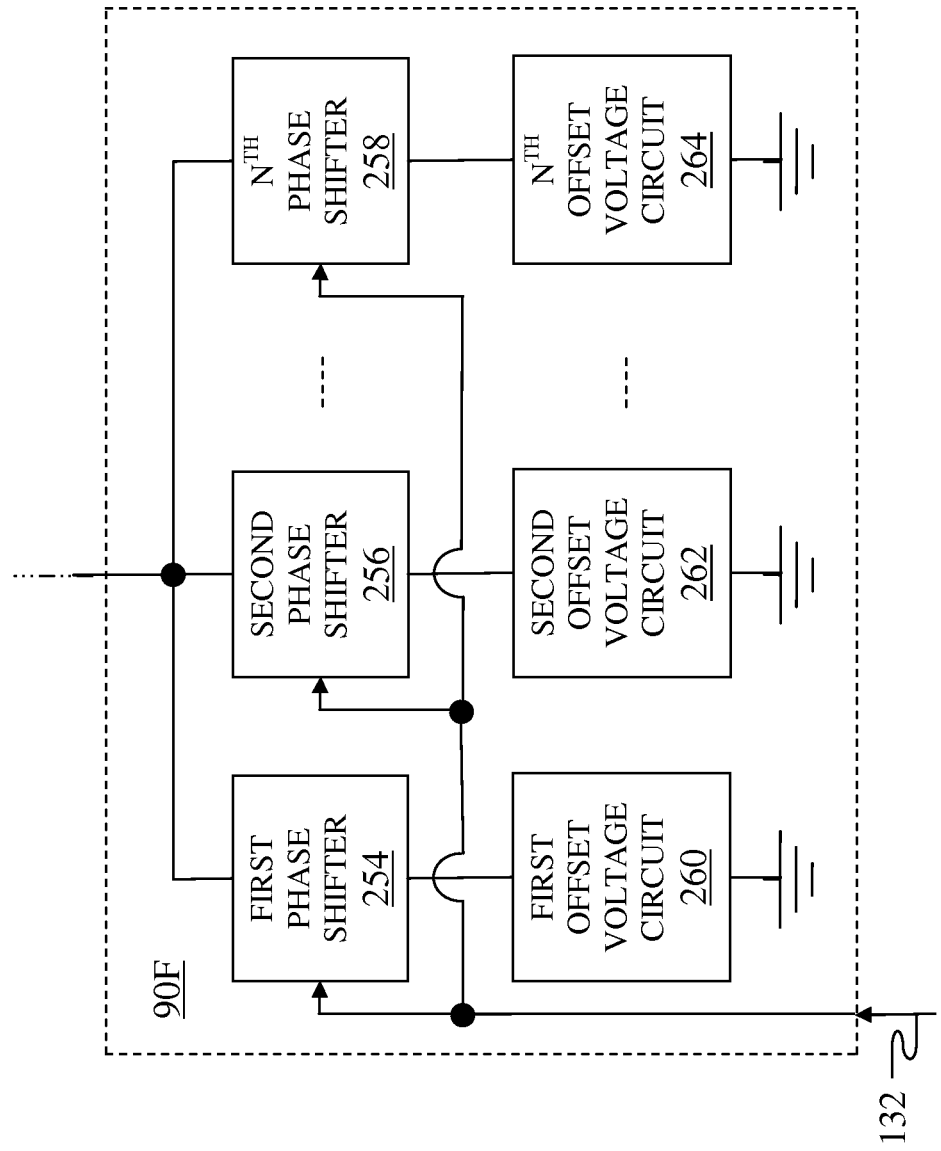
FIG. 21 shows details of a driver stage phase control block illustrated in FIG. 6 according to one embodiment of the driver stage phase control block.

FIG. 21 shows details of the driver stage phase control block 90F illustrated in FIG. 6 according to one embodiment of the driver stage phase control block 90F. The driver stage phase control block 90F includes a first phase shifter 254, a second phase shifter 256, and up to and including an $N^{TH}$ phase shifter 258. In this regard, the driver stage phase control block 90F includes a group of phase shifters 254, 256, 258. Each of the group of phase shifters 254, 256, 258 receives the first phase control signal 132. In this regard, a capacitance of each of the group of phase shifters 254, 256, 258 is controlled by the first phase control signal 132. Each of the group of phase shifters 254, 256, 258 is coupled to one another and coupled to the RF amplification circuit 36(1). As such, the capacitance of each of the group of phase shifters 254, 256, 258 is combined into a total capacitance, which is presented to the RF amplification circuit 36(1) and varied based on the first phase control signal 132. The total capacitance applies a phase-shift to the RF amplification circuit 36(1). As a result, the phase-shift is varied based on the first phase control signal 132. In one embodiment of the group of phase shifters 254, 256, 258, each of the group of phase shifters 254, 256, 258 includes at least one varactor diode.

In one embodiment of the group of phase shifters 254, 256, 258, the $N^{TH}$ phase shifter 258 is omitted, such that the group of phase shifters 254, 256, 258 includes only the first phase shifter 254 and the second phase shifter 256. Additionally, the driver stage phase control block 90F further includes a first offset voltage circuit 260, a second offset voltage circuit 262, and up to and including an $N^{TH}$ offset voltage circuit 264. In this regard, the driver stage phase control block 90F includes a group of offset voltage circuits 260, 262, 264. In one embodiment of the group of offset voltage circuits 260, 262, 264, the $N^{TH}$ offset voltage circuit 264 is omitted. Each of the group of offset voltage circuits 260, 262, 264 has a different voltage.

The first phase shifter 254 and the first offset voltage circuit 260 are coupled in series to form a first phase shifting circuit. The second phase shifter 256 and the second offset voltage circuit 262 are coupled in series to form a second phase shifting circuit. The $N^{TH}$ phase shifter 258 and the $N^{TH}$ offset voltage circuit 264 are coupled in series to form an Nth phase shifting circuit. In general, the driver stage phase control block 90F includes a group of phase shifting circuits coupled in parallel with one another. Since each of the group of offset voltage circuits 260, 262, 264 has a different voltage, each of the group of phase shifting circuits has a different response to the first phase control signal 132. In one embodiment of the group of phase shifting circuits, each phase shifting circuit includes at least one varactor diode. As such, the group of phase shifting circuits is a group of varactor circuits, such that each of the group of varactor circuits is coupled in parallel with one another.

Figure 22:
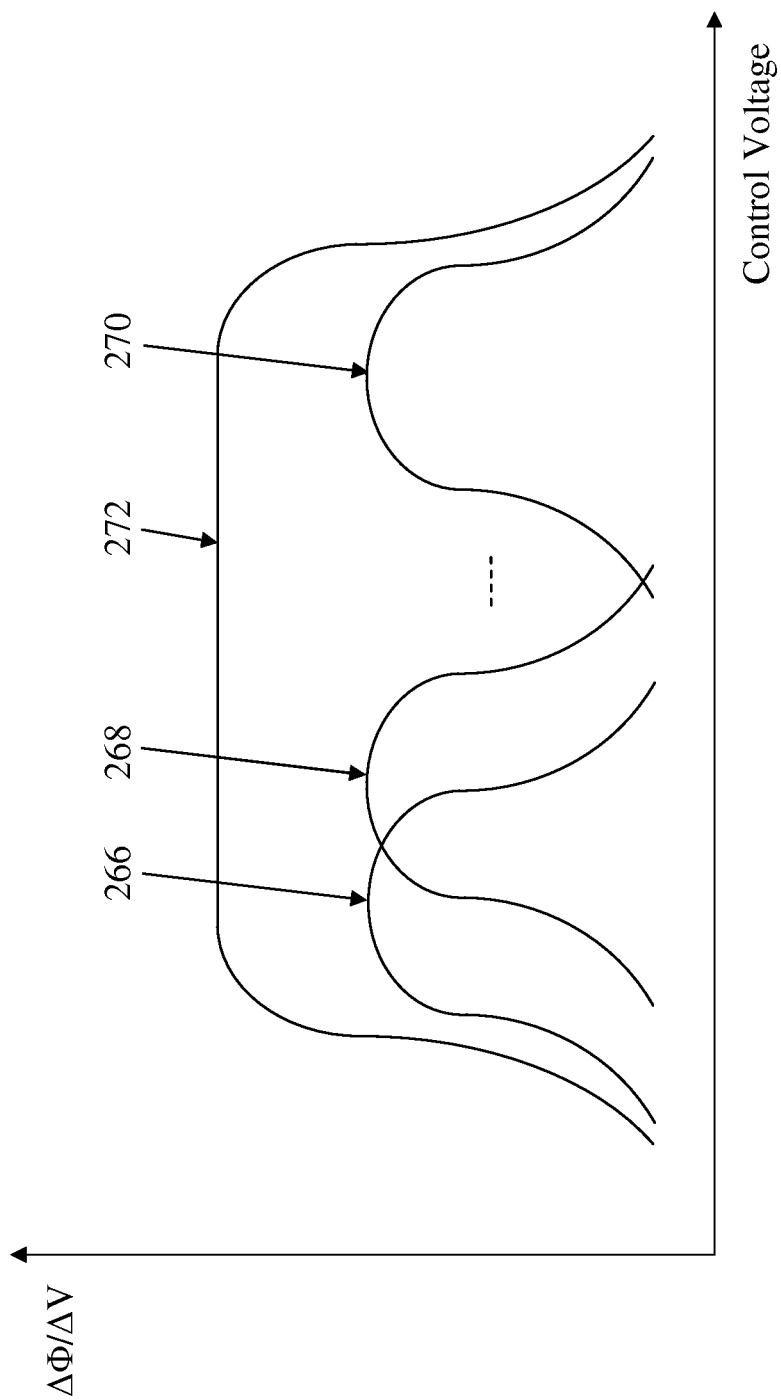
FIG. 22 is a graph showing curves that illustrate a phase-to-voltage response of a group of phase shifting circuits illustrated in FIG. 21 according to one embodiment of the group of phase shifting circuits.

FIG. 22 is a graph showing curves that illustrate a phase-to-voltage response of the group of phase shifting circuits illustrated in FIG. 21 according to one embodiment of the group of phase shifting circuits. A control voltage is provided by the first phase control signal 132. A first phase shifter response curve 266 is associated with the first phase shifting circuit. A second phase shifter response curve 268 is associated with the second phase shifting circuit. An $N^{TH}$ phase shifter response curve 270 is associated with the $N^{TH}$ phase shifting circuit. As such, the first phase shifter response curve 266, the second phase shifter response curve 268, and up to and including the $N^{TH}$ phase shifter response curve 270 form a group of response curves 266, 268, 270, which combine to provide a driver stage phase control block response curve 272. Each of the group of response curves 266, 268, 270 has a hump shape. However, each of the group of response curves 266, 268, 270 combines with others of the group of response curves 266, 268, 270 to provide the driver stage phase control block response curve 272, which has a relatively flat operating region.

Figure 23:
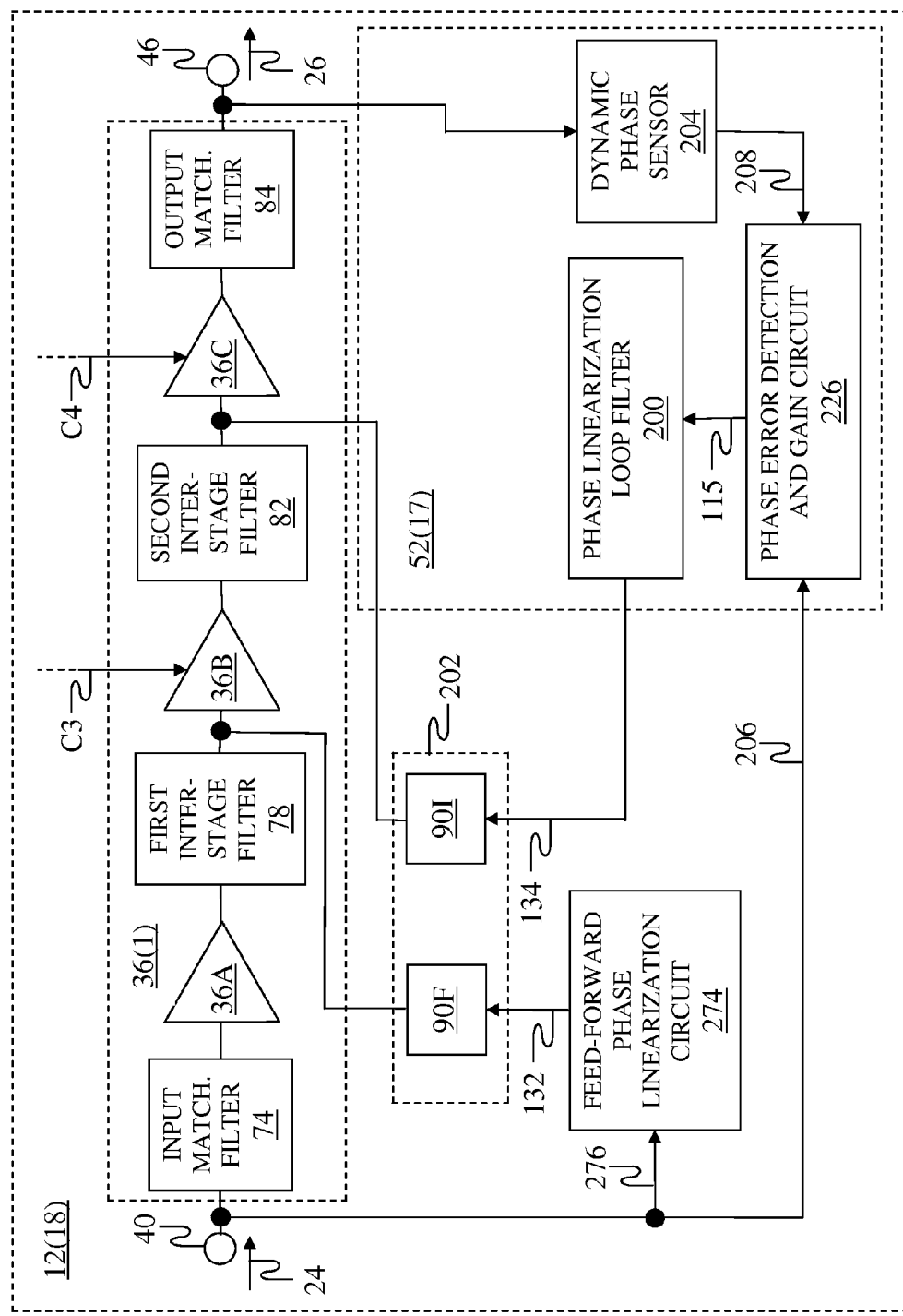
FIG. 23 illustrates details of a partial embodiment of the RF amplification device shown in FIG. 1 according to another embodiment of the RF amplification device.
Figure 24A:
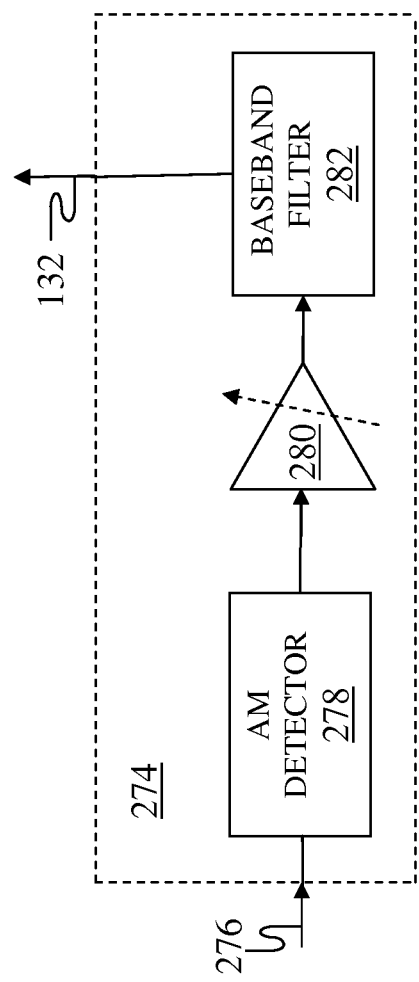
FIG. 24 shows details of a feed-forward phase linearization circuit illustrated in FIG. 23 according to one embodiment of the feed-forward phase linearization circuit.
Figure 24B:
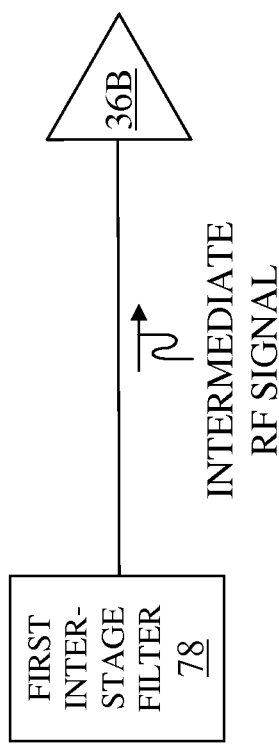
Figure 24C:
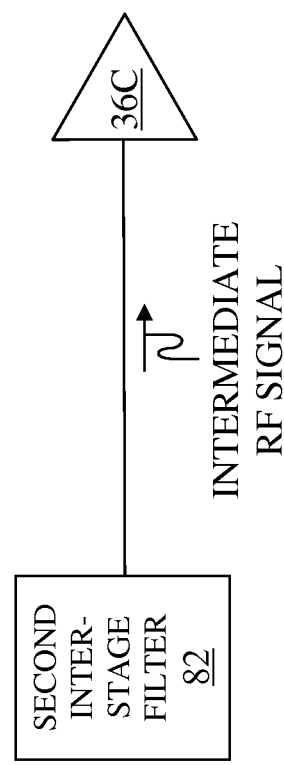
Figure 24D:
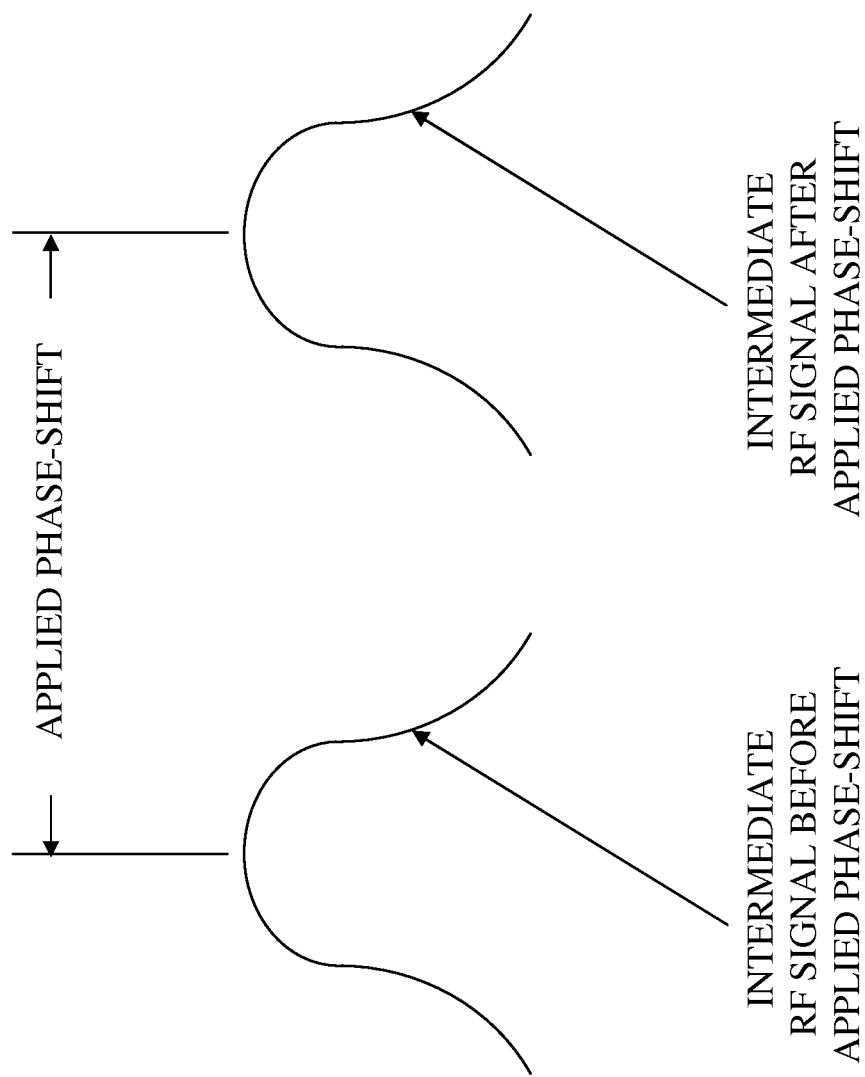
Figure 24E:
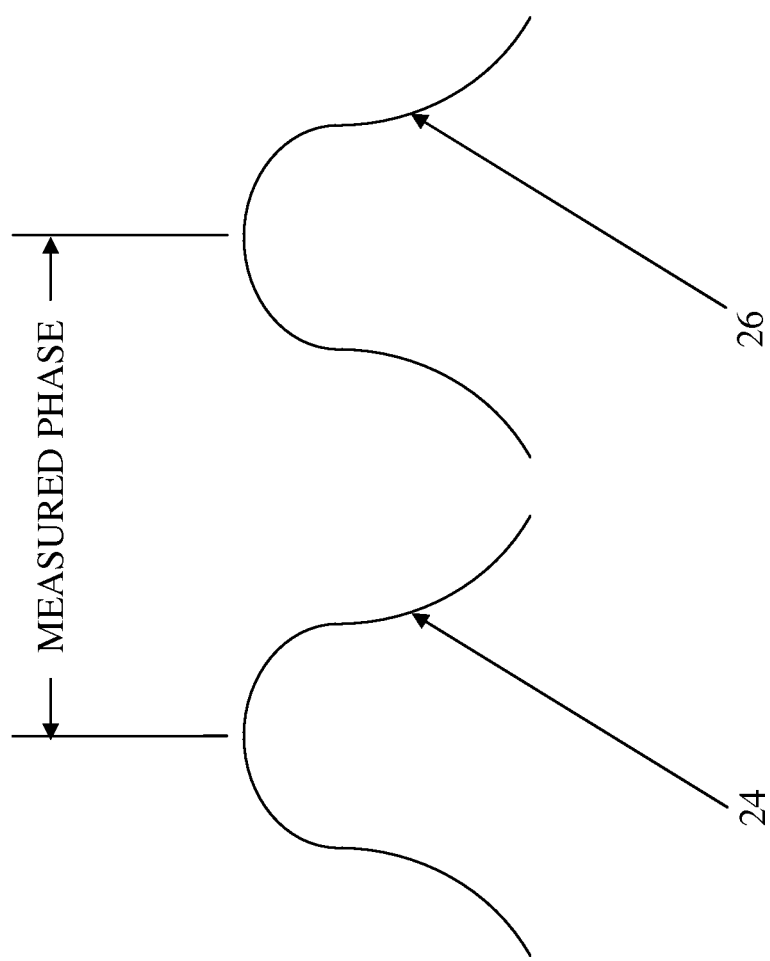
Figure 24F:
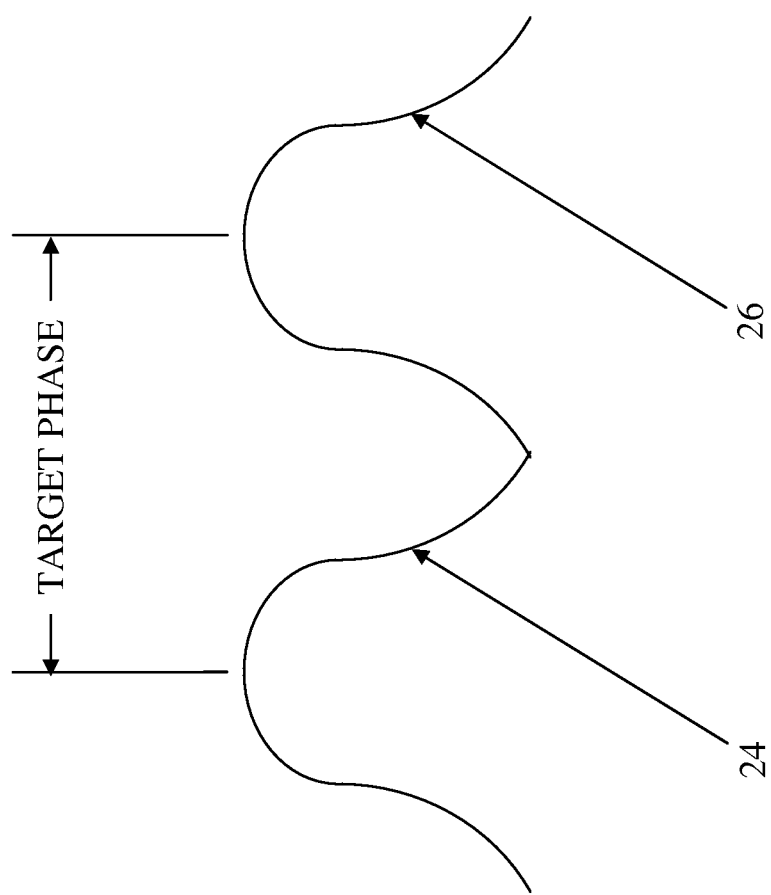

FIG. 23 illustrates details of a partial embodiment of the RF amplification device 12 shown in FIG. 1 according to another embodiment of the RF amplification device 12. The RF amplification device 12(18) is similar to the RF amplification device 12(14) illustrated in FIG. 16, except the RF amplification device 12(18) illustrated in FIG. 23 further includes a feed-forward phase linearization circuit 274 coupled between the input terminus 40 and the driver stage phase control block 90F. As such, the feed-forward phase linearization circuit 274 provides feed-forward linearization of the RF amplification circuit 36(1). In this regard, the feed-forward phase linearization circuit 274 receives an amplitude reference signal 276 and provides the first phase control signal 132 based on the amplitude reference signal 276.

FIG. 24 shows details of the feed-forward phase linearization circuit 274 illustrated in FIG. 23 according to one embodiment of the feed-forward phase linearization circuit 274. The feed-forward phase linearization circuit 274 includes an AM detector 278, a variable gain amplifier 280, and a baseband filter 282 coupled in series between the input terminus 40 and the driver stage phase control block 90F.

Those skilled in the art will recognize improvements and modifications to the embodiments of the present disclosure.

All such improvements and modifications are considered within the scope of the concepts disclosed herein and the claims that follow.

What is claimed is:

1. Circuitry comprising:
    a package interface configured to receive a radio frequency (RF) signal and provide an amplified RF signal;
    an RF amplification circuit configured to amplify the RF signal to generate the amplified RF signal, such that an intermediate RF signal is generated during amplification of the RF signal; and
    a closed-loop phase linearization circuit configured to:
        endogenously establish a target phase of the amplified RF signal using the RF signal; and
        apply a phase-shift to the intermediate RF signal based on a difference between the target phase and a measured phase, which is representative of a phase of the amplified RF signal, wherein the phase-shift reduces phase distortion in the amplified RF signal.

2. The circuitry of claim 1 wherein the phase distortion in the RF amplification circuit is at least partially based on amplitude variations of the RF signal.

3. The circuitry of claim 1 wherein an overall phase response of the RF amplification circuit includes the phase distortion, a static phase response of the RF amplification circuit, and a phase-drift of the RF amplification circuit, such that a frequency of the phase-drift is less than about 100 hertz and a frequency of the phase distortion is greater than about 100 hertz.

4. The circuitry of claim 1 wherein the closed-loop phase linearization circuit comprises a phase error detection circuit configured to:
    receive a phase reference signal, which is based on the target phase;
    receive a phase feedback signal, which is based on the measured phase; and
    provide a phase error signal based on a phase difference between the phase reference signal and the phase feedback signal, such that the closed-loop phase linearization circuit is further configured to reduce the phase distortion based on the phase error signal.

5. The circuitry of claim 4 wherein:
    the RF amplification circuit is further configured to output the amplified RF signal from an output terminus, which is coupled to the package interface;
    the closed-loop phase linearization circuit further comprises a dynamic phase sensor directly coupled between the output terminus and the phase error detection circuit;
    the dynamic phase sensor is configured to provide the phase feedback signal based on further detecting the phase distortion in the amplified RF signal; and
    the dynamic phase sensor is further configured to be substantially unresponsive to both a static phase response of the RF amplification circuit and a phase-drift of the RF amplification circuit.

6. The circuitry of claim 4 wherein:
    the RF amplification circuit comprises a final RF amplifier stage, such that the amplified RF signal is based on the final RF amplifier stage;
    the closed-loop phase linearization circuit further comprises a final stage replica amplifier, which is configured to replicate an output current from the final RF amplifier stage to provide a feedback signal and at least partially reject voltage standing wave ratio (VSWR) variations from the feedback signal;
    the feedback signal is representative of the phase distortion; and
    the phase feedback signal is based on the feedback signal.

7. The circuitry of claim 6 wherein the closed-loop phase linearization circuit further comprises a harmonic filter and a dynamic phase sensor coupled in series between the final stage replica amplifier and the phase error detection circuit.

8. The circuitry of claim 4 wherein the closed-loop phase linearization circuit further comprises a harmonic filter and a dynamic phase sensor coupled in series between the RF amplification circuit and the phase error detection circuit, such that the phase feedback signal is further based on the harmonic filter and the dynamic phase sensor.

9. The circuitry of claim 4 wherein:
    the closed-loop phase linearization circuit further comprises a harmonic filter and a delay matching circuit;
    the harmonic filter is coupled between the RF amplification circuit and the phase error detection circuit;
    the delay matching circuit is coupled between the RF amplification circuit and the phase error detection circuit;
    a delay of the delay matching circuit is approximately equal to a delay of the harmonic filter;
    the delay matching circuit is configured to provide the phase reference signal; and
    the phase feedback signal is further based on the harmonic filter.

10. The circuitry of claim 4 wherein:
    the RF amplification circuit is further configured to receive the RF signal from an input terminus, which is coupled to the package interface;
    the phase error detection circuit is directly coupled to the input terminus; and
    the RF signal is the phase reference signal.

11. The circuitry of claim 4 wherein:
    the RF amplification circuit is further configured to receive the RF signal from an input terminus, which is coupled to the package interface;
    the RF amplification circuit comprises an input match filter directly coupled to the input terminus;
    the phase error detection circuit is directly coupled to the input match filter; and
    the input match filter is configured to provide the phase reference signal.

12. The circuitry of claim 4 wherein:
    the RF amplification circuit comprises an input match filter and an initial RF amplifier stage;
    the phase error detection circuit is directly coupled to a connection node between the input match filter and the initial RF amplifier stage; and
    the connection node is configured to provide the phase reference signal.

13. The circuitry of claim 4 wherein:
    the RF amplification circuit comprises an initial RF amplifier stage;
    the phase error detection circuit is directly coupled to an output from the initial RF amplifier stage; and
    the output from the initial RF amplifier stage is configured to provide the phase reference signal.

14. The circuitry of claim 4 wherein:
    the RF amplification circuit is further configured to output the amplified RF signal from an output terminus, which is coupled to the package interface;
    the RF amplification circuit is further configured to receive the RF signal from an input terminus, which is coupled to the package interface;
    a first end of the phase error detection circuit is coupled to the RF amplification circuit toward the input terminus;

a second end of the phase error detection circuit is coupled to the RF amplification circuit toward the output terminus;

the first end of the phase error detection circuit is configured to receive the phase reference signal; and the second end of the phase error detection circuit is configured to receive the phase feedback signal.

15. The circuitry of claim 14 wherein the closed-loop phase linearization circuit further comprises an open loop input phase correction circuit coupled to the first end of the phase error detection circuit, such that the open loop input phase correction circuit is configured to further reduce the phase distortion in the RF amplification circuit.

16. The circuitry of claim 14 wherein the closed-loop phase linearization circuit further comprises an open loop output phase correction circuit coupled to the second end of the phase error detection circuit, such that the open loop output phase correction circuit is configured to further reduce the phase distortion in the RF amplification circuit.

17. The circuitry of claim 4 wherein:

the RF amplification circuit is further configured to output the amplified RF signal from an output terminus, which is coupled to the package interface;

the RF amplification circuit is further configured to receive the RF signal from an input terminus, which is coupled to the package interface;

the RF amplification circuit comprises a plurality of RF amplifier stages coupled in series between the input terminus and the output terminus;

the closed-loop phase linearization circuit further comprises a plurality of phase control blocks, such that each of the plurality of phase control blocks is coupled to a corresponding one of the plurality of RF amplifier stages; and the plurality of phase control blocks is configured to reduce the phase distortion in the RF amplification circuit based on the phase error signal.

18. The circuitry of claim 17 wherein each of the plurality of phase control blocks comprises a plurality of varactor circuits, such that each of the plurality of varactor circuits is coupled in parallel with one another.

19. The circuitry of claim 4 wherein:

the RF amplification circuit comprises a plurality of RF amplifier stages coupled in series;

the closed-loop phase linearization circuit further comprises a phase control block, such that the phase control block is coupled to one of the plurality of RF amplifier stages; and the phase control block is configured to reduce the phase distortion in the RF amplification circuit based on the phase error signal.

20. The circuitry of claim 4 wherein the phase error detection circuit comprises an RF mixer, such that the phase error signal is based on mixing the phase reference signal and the phase feedback signal.

21. The circuitry of claim 19 wherein the phase reference signal functions as a local oscillator signal.

22. The circuitry of claim 1 wherein the closed-loop phase linearization circuit comprises a slow phase delay loop and a fast phase delay loop, wherein:

the slow phase delay loop is configured to receive a phase reference signal, which is based on the target phase;

the slow phase delay loop is further configured to receive a phase feedback signal, which is based on the measured phase;

the slow phase delay loop is further configured to provide a dynamic phase reference signal based on a phase difference between the phase reference signal and the phase feedback signal;

the fast phase delay loop is configured to receive the phase feedback signal and the dynamic phase reference signal;

the fast phase delay loop is further configured to provide at least one phase control signal based on a phase difference between the dynamic phase reference signal and the phase feedback signal, such that the fast phase delay loop is substantially unresponsive to both a static phase response of the RF amplification circuit and a phase-drift of the RF amplification circuit; and the closed-loop phase linearization circuit is further configured to reduce the phase distortion based on the at least one phase control signal.

23. The circuitry of claim 1 wherein the closed-loop phase linearization circuit comprises a phase error detection and gain circuit configured to:

receive a phase reference signal, which is based on the target phase and the RF signal;

receive a phase feedback signal, which is based on the measured phase;

provide a phase error signal based on a phase difference between the phase reference signal and the phase feedback signal; and adjust a magnitude of the phase error signal based on an amplitude of the phase reference signal, such that the closed-loop phase linearization circuit is further configured to reduce the phase distortion based on the phase error signal.

24. The circuitry of claim 1 wherein:

a plurality of intermediate RF signals is generated during amplification of the RF signal, such that the plurality of intermediate RF signals comprises the intermediate RF signal; and the closed-loop phase linearization circuit is further configured to apply a phase-shift to each of the plurality of intermediate RF signals.

25. A method comprising:

using a package interface to receive a radio frequency (RF) signal and provide an amplified RF signal;

amplifying the RF signal to generate the amplified RF signal using an RF amplification circuit, such that an intermediate RF signal is generated during amplification of the RF signal;

endogenously establishing a target phase of the amplified RF signal using the RF signal; and applying a phase-shift to the intermediate RF signal based on a difference between the target phase and a measured phase, which is representative of a phase of the amplified RF signal, wherein the phase-shift reduces phase distortion in the amplified RF signal.

* * * * *

UNITED STATES PATENT AND TRADEMARK OFFICE
CERTIFICATE OF CORRECTION

PATENT NO. : 9,294,046 B2  
APPLICATION NO. : 14/216794  
DATED : March 22, 2016  
INVENTOR(S) : Baker Scott, George Maxim and Dirk Robert Walter Leipold Page 1 of 1

It is certified that error appears in the above-identified patent and that said Letters Patent is hereby corrected as shown below:

In the Specification:

In column 16, line 4, replace "control block 900" with --control block 90G--.

In column 18, lines 22, 26, 29, 35, and 45, replace "control block 900" with --control block 90G--.

Signed and Sealed this
Twenty-fourth Day of May, 2016

Michelle K. Lee
*Director of the United States Patent and Trademark Office*